US007245361B2

(12) United States Patent
Yamaguchi et al.

(10) Patent No.: US 7,245,361 B2
(45) Date of Patent: Jul. 17, 2007

(54) METHOD FOR EVALUATING REFRACTIVE INDEX HOMOGENEITY OF OPTICAL MEMBER

(75) Inventors: Yutaka Yamaguchi, Sagamihara (JP); Masaaki Mochida, Yamato (JP); Atsushi Yanagisawa, Machida (JP); Hiroshi Niikura, Chigasaki (JP)

(73) Assignee: Nikon Corporation, Tokyo (JP)

( * ) Notice: Subject to any disclaimer, the term of this patent is extended or adjusted under 35 U.S.C. 154(b) by 285 days.

(21) Appl. No.: 11/002,456

(22) Filed: Dec. 3, 2004

(65) Prior Publication Data

US 2005/0140967 A1 Jun. 30, 2005

Related U.S. Application Data

(63) Continuation of application No. PCT/JP03/07063, filed on Jun. 4, 2003.

(30) Foreign Application Priority Data

Jun. 4, 2002 (JP) ............................. 2002-162628

(51) Int. Cl.
*G01B 9/00* (2006.01)
*G01N 21/41* (2006.01)
(52) U.S. Cl. ....................... 356/124; 356/128
(58) Field of Classification Search ................ 356/121, 356/123–128
See application file for complete search history.

(56) References Cited

U.S. PATENT DOCUMENTS 2,444,457 A * 7/1948 Marks et al. ............... 359/812
4,733,945 A * 3/1988 Bacich ....................... 359/820
4,773,864 A * 9/1988 Holt .......................... 434/262
4,778,252 A * 10/1988 Filho ......................... 359/819
4,934,818 A * 6/1990 Glantschnig et al. ...... 356/73.1

(Continued)

FOREIGN PATENT DOCUMENTS

JP A-61-187605 8/1986

(Continued)

OTHER PUBLICATIONS

Wyant, James C., "Basic Wavefront Aberration Theory for Optical Metrology", 1992, Applied Optics and Optical Engineering, vol. XI.*

*Primary Examiner*—Layla G. Lauchman
*Assistant Examiner*—Bryan Giglio
(74) *Attorney, Agent, or Firm*—Oliff & Berridge PLC

(57) ABSTRACT

A method for evaluating the refractive index homogeneity of an optical member includes passing light through an optical member (1) used for photolithography. The side surface (1a) with respect to the optical axis (AX) of the optical member (1) is retained by elastic members (4) at a plurality of positions disposed at equal intervals to pass light through the optical member (1) and measure a wave front aberration. The optical member is rotated around the optical axis (AX) by the equal interval to measure a wave front aberration again and determine the difference from the initial measurement. The optical member (1) is moved in a direction perpendicular to the optical axis (AX) to measure a wave front aberration again and determined the difference from the initial measurement. The refractive index homogeneity of the optical member can be accurately evaluated from those differences by using fitting of the Zernike cylindrical function.

10 Claims, 14 Drawing Sheets

U.S. PATENT DOCUMENTS

| | | | | |
|---|---|---|---|---|
| 4,938,489 A | * | 7/1990 | Nemirovsky | 279/133 |
| 5,422,714 A | * | 6/1995 | Fladd | 356/128 |
| 5,462,475 A | * | 10/1995 | Kennedy | 451/384 |
| 6,025,955 A | * | 2/2000 | Hiraiwa et al. | 359/355 |
| 6,239,924 B1 | | 5/2001 | Watson et al. | |
| 6,827,093 B2 | * | 12/2004 | Muster et al. | 134/153 |

FOREIGN PATENT DOCUMENTS

| | | |
|---|---|---|
| JP | U-61-165514 | 10/1986 |
| JP | A-08-005505 | 1/1996 |
| JP | A-11-125512 | 5/1999 |
| JP | A-2001-074991 | 3/2001 |

* cited by examiner

FIG. 6

| | Lower order $r_{rot}$ | Lower order $r_{odd}$ | Lower order $r_{evn}$ | Middle order $r_{rot}$ | Middle order $r_{odd}$ | Middle order $r_{evn}$ | Higher order $r_{rot}$ | Higher order $r_{odd}$ | Higher order $r_{evn}$ | Residual RMS | Judgement |
|---|---|---|---|---|---|---|---|---|---|---|---|
| Example 1 | 0.01 | 0.01 | 0.01 | 0.005 | 0.006 | 0.003 | 0.0015 | 0.0015 | 0.002 | 0.001 | ○ |
| Example 2 | 0.008 | 0.008 | 0.009 | 0.004 | 0.005 | 0.002 | 0.0015 | 0.0015 | 0.0010 | 0.0008 | ○ |
| Comparative Example 1 | 0.05 | 0.02 | 0.02 | 0.015 | 0.008 | 0.008 | 0.003 | 0.003 | 0.003 | 0.004 | × |
| Comparative Example 2 | 0.04 | 0.02 | 0.02 | 0.01 | 0.008 | 0.008 | 0.003 | 0.003 | 0.003 | 0.003 | × |

(× λ)

○···Usable    △···Usable depending on condition    ×···Unsuitable

METHOD FOR EVALUATING REFRACTIVE INDEX HOMOGENEITY OF OPTICAL MEMBER

CROSS-REFERENCE

This application is a Continuation Application of International Application No. PCT/JP03/07063 which was filed on Jun. 4, 2003 claiming the conventional priority of Japanese patent Application No. 2002-162628 filed on Jun. 4, 2002.

BACKGROUND OF THE INVENTION

1. Field of the Invention

The present invention relates to a method for evaluating an optical member for an optical element such as a lens and a prism used for the photolithography technique.

2. Description of the Related Art

Exposure apparatuses for the photolithography are used to produce, for example, semiconductor devices such as LSI, liquid crystal display devices, and thin film magnetic heads. In such an exposure apparatus, a light, which is emitted from a light source, is radiated via an illumination optical system onto a pattern formed on a projection master plate such as a mask or a reticle. The pattern, which is irradiated with the light beam, is projected by a projection optical system onto a photosensitive substrate such as a glass plate or a wafer previously applied with a photoresist. The types of the projection optical system include the refractive type projection optical system which is constructed only by lenses for transmitting and refracting the light beam having the exposure wavelength, the reflection type projection optical system which is constructed only by mirrors for reflecting the light beam having the exposure wavelength, and the catadioptric type projection optical system which is constructed by lenses and mirrors in combination.

In recent years, the degree of integration is increasingly enhanced, for example, for the semiconductor device, the liquid crystal display device, and the thin film magnetic head. The pattern, which is transferred onto the substrate, is continuously made more fine and minute. Therefore, the wavelength is progressively shortened for the exposure apparatus for the photolithography such that the light source is changed from the i-ray (365 nm) to the KrF excimer laser (248 nm), the ArF excimer laser (193 nm), and the $F_2$ laser (157 nm). Accordingly, higher optical performance is required for the optical system of the exposure apparatus for the photolithography. In particular, extremely high optical performance, in which the resolution is high and the aberration is approximately zero, is required for the projection optical system for transferring the fine and minute pattern on the mask onto the photosensitive surface of the wafer. In order to satisfy the request as described above, an extremely high level is required for the refractive index homogeneity of the optical material (hereinafter referred to as "optical member for the photolithography" as well) to be used, for example, for the lens, the prism, and the photomask as constitutive elements for the optical system of the exposure apparatus for the photolithography. That is, the absence of any nonuniformity (refractive index homogeneity) is important for the optical member for the photolithography.

The refractive index homogeneity of the optical member for the photolithography has been hitherto evaluated as follows. That is, a light beam is allowed to pass through the optical member to measure the wave front aberration generated in this situation. The evaluation is made by using an index such as the difference between the maximum value and the minimum value (hereinafter referred to as "PV value") and the root mean square (hereinafter referred to as "RMS value"). That is, when the PV value and the RMS value are smaller, the evaluation is made such that the optical member is excellent. Therefore, the optical member, which is regarded to have a high quality, has been produced in order to decrease these values.

Japanese Patent Application Laid-open No. 8-5505 describes a method for evaluating the refractive index homogeneity. An explanation will be briefly made below with reference to FIG. 10 about a specified procedure of this method.

(1) An optical member for the photolithography, which was polished to have a columnar or prism-shaped configuration, is set to an interferometer, and a reference wave front is emitted on the polished surface to measure the wave front aberration. The measured wave front aberration includes any error aberration resulting from the refractive index distribution of the optical member. Therefore, information about the refractive index distribution is obtained by analyzing the aberration. In particular, the error aberration, which results from the curvature component, is referred to as "power component" or "focus component". Further, the error aberration, which results from the inclination component, is referred to as "tilt component".

(2) The power component and the tilt component are removed from the measured wave front aberration.

(3) Further, the wave front aberration, which results from the astigmatic component, is removed.

(4) The remaining wave front aberration is separated into the rotational symmetry component and the rotational asymmetry component (random component).

(5) The PV value and the RMS value of the rotational asymmetry component (random component) are determined, and these values are used to make the evaluation.

(6) The rotational symmetry component is subjected to the fitting to the aspherical formula by the least squares method, and the 2nd order and the 4th order components are removed to determine the PV values and the RMS values of the remaining wave front components of the eventh orders of the 6th order or higher orders (hereinafter referred to as 2nd order 4th order residual". The values are used to make the evaluation. That is, the optical member, in which the rotational asymmetry component (random component) and the 2nd order 4th order residual are small, is the optical member in which the refractive index homogeneity is satisfactory. It has been tried to produce the optical member as described above.

The wave front aberration of the optical member for the photolithography is measured by using the interferometer. Those generally usable as the interferometer include the Fizeau type interferometer for measuring the flat optical member by using a light source of a He—Ne laser having a wavelength of 633 nm. The interferometer has such a structure that a measurement objective is interposed and fixed between two parallel flat plates. The procedure is more faithful to the principle, in which the KrF excimer laser (248 nm) or the ArF excimer laser (193 nm) is used as the light source to be employed for the measurement of the wave front aberration. However, the He—Ne laser is used in many cases, for example, because of the cost of the interferometer, the size, and the measurement stability.

In order to highly accurately measure the wave front aberration of the optical member by using the interferometer, it is necessary to measure the interference light beam while effectively avoiding the scattering of the measuring light beam from the surface of the measurement objective. In order to reduce the influence of the scattering of the measuring light beam, it is desirable to use a method called "oil-on-plate method" in which the optical member as the measurement objective is interposed between the two parallel flat plates, and the gaps therebetween are filled with a transparent oil.

An explanation will be made about a method with reference to illustrative views shown in FIGS. 11A and 11B. At first, the Fizeau type interferometer, which is used for the measurement, is explained. The Fizeau type interferometer is composed of a main body section 21, a reference surface object 22, two parallel flat plates 23, and a reflecting surface 25. Before an optical member 24 as the measurement objective is set to the interferometer, the two parallel flat plates 23 are arranged close to each other, and the gap therebetween is filled with a transparent oil 26 which has approximately the same refractive index as that the measurement objective. In this state, the reference wave front based on the laser beam is radiated to photograph the transmitted light beam, and thus the wave front aberration data is obtained. This state is shown in FIG. 11A. Subsequently, the gaps between the parallel flat plates 23 and the optical member 24 are filled with the transparent oil 26 in a state in which the optical member 24 is set between the two parallel flat plates 23. In this state, the transmitted light beam is photographed to obtain the wave front aberration data. This state is shown in FIG. 11B. Subsequently, the wave front aberration data, which is measured in the state in which the optical member is not set, is subtracted from the wave front aberration data which is measured in the state in which the optical member 24 is set. Accordingly, the influence of the measurement error, which results from the wave front aberration depending on the surface shape of the optical member 24, is removed, simultaneously with which the error caused by the wave front aberration resulting from the interferometer is removed as well to measure only the wave front aberration in the optical member 24. That is, it is possible to determine the wave front aberration inherent in the optical member.

The principle will be explained in detail below. It is assumed that W represents the wave front aberration which depends on the internal homogeneity of the optical member, E represents the wave front aberration which depends on the interferometer, and O represents the wave front aberration which depends on the oil. On this assumption, the wave front measurement data $D_1$, which is measured in the state in which the optical member is set, is expressed as follows.

$$D_1 = W + E + O \quad (1)$$

The wave front measurement data $D_2$, which is measured in the state in which the optical member is not set, includes the wave front aberration E depending on the interferometer and the wave front aberration O depending on the oil. Therefore, the wave front measurement data $D_2$ is expressed as follows.

$$D_2 = E + O \quad (2)$$

Therefore, when the wave front measurement data $D_2$, which is measured in the state in which the optical member is not set, is subtracted from the wave front measurement data $D_1$ which is measured in the state in which the optical member is set, the following expression is obtained.

$$D_1 - D_2 = W + E + O - (E + O) = W \quad (3)$$

Only the wave front aberration W, which depends on the internal homogeneity of the optical member, is separated and determined.

When the wave front aberration is actually measured, the measurement area is divided into a plurality of measurement elements to obtain measured values for each of the elements. The measured values are connected and combined to thereby grasp the wave front aberration of the entire measurement area. As for the number of the measurement elements, when the cross section is circular, it is desirable that the measured values of the respective elements are obtained in relation to the number of the elements obtained by dividing a square area with the inscribing circle of the circular cross section into not less than 50×50 meshes. It is desirable that the number of the elements (number of measuring points) is changed depending on the diameter of the measurement objective. It is more desirable that the number of the elements (number of measuring points) is determined while considering the light flux diameter (partial diameter) when the lens, which is obtained by processing the optical member, is used as well. For example, in an optical system shown in FIG. 9, the light flux, which has been transmitted through the reticle R, is focused on the surface of the wafer W after passing through lens groups from G1 to G6. In this situation, the light flux diameters (partial diameters) differ in relation to the transmittance through the respective lenses. That is, the lens, which is disposed near to the reticle R, has the light flux diameter which is smaller than the light flux diameter of the lens which is disposed far from the reticle R (near to the wafer W). When the number of the measurement elements is set for the optical member to be used for each of the lenses as described above so that the number of the measuring points in the light flux diameter of the lens is approximately equivalent, it is possible to perform the measurement with approximately equivalent accuracies for the lenses of the plurality of types. In the method in which the number of the measurement elements is set taking the light flux diameter into consideration, if it is intended to perform the measurement comprehensively for the inside of the effective diameter of the lens of the optical member to be used for the lens which has the large effective diameter and which has the small light flux diameter, the number of the measurement elements is extremely large. In such a case, the wave front aberration is measured for each of a plurality of areas of the optical member, and the obtained pieces of the wave front aberration data are combined. Thus, it is possible to obtain the entire wave front aberration data. Those usable for the measurement of the wave front aberration include the Twyman-Green type interferometer and the Shearing type interferometer other than the Fizeau type interferometer as well.

The measured wave front aberration data is dealt with as follows as shown in FIG. 8. That is, the coordinate system is defined on the outgoing pupil plane 80 of the optical member, and the obtained wave front aberration is expressed by using the coordinate system. That is, the polar coordinates are defined on the outgoing pupil plane, and the obtained wave front aberration W is expressed as $W(\rho, \theta)$.

Japanese Patent Application No. 2002-162628 describes the following procedure. That is, the transmission wave front data of an optical member is subjected to the Zernike expansion to make separation into the rotational symmetry component, the odd number symmetry component, and the even number symmetry component, and they are further separated depending on the orders into a plurality of portions (lower order, middle order, higher order) so that the evaluation is made in accordance with the respective RMS values. It is also described that the optical member is rotated and laterally shifted, and the transmission wave front data of the optical member is separated into the rotational symmetry component and the rotational asymmetry component.

The interferometer includes the two types, i.e., the type in which the surface, through which the light beam comes into the optical member, is set in the vertical direction (i.e., called "lateral type" because of the horizontal optical axis), and the type in which the surface, through which the light beam comes into the optical member, is set in the horizontal direction (i.e., called "vertical type" because of the vertical optical axis).

In the case of the lateral type, the optical member is set in a standing form. Therefore, the load of the optical member is concentrated on the lower support, and any strain tends to appear in the optical member. Further, the oil, which is charged between the parallel flat plate and the optical member, flows downwardly due to its self-weight. Therefore, any error, which is caused by this fact, tends to be mixed into the measured value. Therefore, the lateral type is not suitable for the highly accurate measurement of the wave front aberration.

Therefore, in order to measure the wave front aberration highly accurately, the vertical type is used. However, in the case of the vertical type, the load of the optical member is received via the oil by the parallel flat plate disposed on the lower side. Therefore, any bending appears in the parallel flat plate disposed on the lower side. Further, the oil, which is charged between the optical member and the parallel flat plate disposed on the lower side, is extruded outwardly to flow due to the load of the optical member. A problem arises such that any error caused by these phenomena is mixed into the measured value.

SUMMARY OF THE INVENTION

The present invention has been achieved in order to solve the problems involved in the conventional technique as described above, an object of which is to provide a method for evaluating the refractive index homogeneity which makes it possible to suppress the flow of oil and cancel any influence caused by stress strain of an optical member brought about by the use of a parallel flat plate. Another object of the present invention is to provide a method for correctly evaluating the refractive index homogeneity of an optical member to be used for the way of use for the photolithography such as semiconductor exposure apparatuses by highly accurately measuring the wave front aberration by using a vertical type interferometer.

According to the present invention, there is provided a method for evaluating refractive index homogeneity of an optical member by measuring wave front aberration of the optical member; the method comprising retaining a side surface around an optical axis of the optical member at a plurality of positions disposed at equal intervals; and measuring the wave front aberration by passing a light beam through the optical member. In the method of the present invention, the load of the optical member can be equivalently retained at the respective retaining positions. Therefore, it is possible to measure the wave front aberration data highly accurately, and it is possible to measure the refractive index homogeneity highly accurately.

In the method of the present invention, it is desirable that the side surface of the optical member is retained so that a surface of the optical member, into which the light beam comes, is horizontal. When the optical member is retained as described above, it is possible to suppress the strain of the optical member by further reducing the load applied to the retaining portions. For example, in the case of the optical member accommodated in a projection optical system of a semiconductor exposure apparatus, the optical axis is usually arranged in the vertical direction. Therefore, it is desirable that the wave front aberration is measured in accordance with the retaining method in conformity with the embodiment of the use as described above.

The optical member, which is used in the method of the present invention, may be a columnar optical member which has a center of rotation of the optical axis. In this arrangement, the optical member may be rotated about the center of the optical axis by an integral multiple of an angle corresponding to the equal interval, and the refractive index homogeneity of the optical member may be evaluated by using wave front aberration data measured before the rotation and wave front aberration data measured after the rotation. When the operation as described above is performed, then it is possible to cancel the stress strain caused by the load applied to the retaining portions of the optical member, and it is possible to measure the refractive index homogeneity highly accurately.

In order to avoid the scattering from the optical member, the optical member may be arranged between two parallel flat plates, wherein gaps between the optical member and the two parallel flat plates are filled with an oil which has substantially the same refractive index as that of the optical member.

The method of the present invention may further comprise a first measuring step of measuring first wave front aberration data by passing the light beam through the two parallel flat plates in a state in which the two parallel flat plates are arranged close and in parallel to each other, and a gap between the two parallel flat plates is filled with the oil which has substantially the same refractive index as that of the optical member, before passing the light beam through the optical member; a second measuring step of measuring second wave front aberration data by passing the light beam through the two parallel flat plates and the optical member in a state in which the optical member is retained between the two parallel flat plates, and the gaps between the parallel flat plates and the optical member are filled with the oil; and a step of calculating third wave front aberration data from a difference between the first wave front aberration data and the second wave front aberration data to evaluate the refractive index homogeneity of the optical member with the third wave front aberration data owing to the added steps, it is possible to cancel the error caused by the measuring apparatus. Therefore, it is possible to measure the refractive index homogeneity more highly accurately.

The method of the present invention may further comprise the steps of:

determining a rotational asymmetry component of the wave front aberration from a difference between the third wave front aberration data before the rotation and an average value of the third wave front aberration data after the rotation; and moving the optical member in a direction perpendicular to the optical axis to determine a difference between wave front aberration data obtained by transmitting the light beam through the optical member after the movement and the wave front aberration data obtained before the movement so that a rotational symmetry component of the wave front aberration is determined from the determined difference, wherein:

the refractive index homogeneity of the optical member is evaluated from wave front aberration data obtained by adding the determined rotational asymmetry component and the rotational symmetry component owing to the added steps, it is possible to obtain the wave front aberration data involving less error. Therefore, it is possible to measure the refractive index homogeneity more highly accurately.

In the method of the present invention, the side surface of the optical member may be retained at the plurality of positions with elastic members respectively. Accordingly, it is possible to avoid the concentration of the stress on one point. Further, in order to uniformize the pattern of the stress strains generated by the retention at the plurality of points so that the stress strains are effectively canceled, it is desirable that the elastic members are pressed against the side surface of the optical member toward the optical axis of the optical member. It is desirable that the number of the positions for retaining the side surface of the optical member is not less than 4, especially not less than 8, and more especially not less than 12.

It is preferable that the method of the present invention is used to evaluate the refractive index homogeneity of the optical member used for the photolithography, especially the refractive index homogeneity of the optical member to be carried on a projection optical system of a semiconductor exposure apparatus.

BRIEF DESCRIPTION OF THE DRAWINGS

FIGS. 1A and 1B show a method for retaining an optical member in which a side surface of the optical member is retained at 8 points, wherein FIG. 1A shows a plan view as viewed in the optical axis direction, and FIG. 1B shows a side view as viewed in a direction perpendicular to the optical axis.

FIGS. 2A and 2B show another method for retaining the optical member in which the side surface of the optical member is retained at 12 points, wherein FIG. 2A shows a plan view as viewed in the optical axis direction, and FIG. 2B shows a side view as viewed in a direction perpendicular to the optical axis.

FIGS. 3A and 3B show a method for retaining a flanged optical member, wherein FIG. 3A shows a plan view as viewed in the optical axis direction, and FIG. 3B shows a side view as viewed in a direction perpendicular to the optical axis.

FIGS. 4A and 4B show a method for retaining the optical member by using retaining plates having circular arc-shaped tips, wherein FIG. 4A shows a plan view as viewed in the optical axis direction, and FIG. 4B shows a side view as viewed in a direction perpendicular to the optical axis.

FIGS. 5A and 5B show a method for retaining the optical member by using circular arc-shaped retaining plates provided with elastic members disposed at tips, wherein FIG. 5A shows a plan view as viewed in the optical axis direction, and FIG. 5B shows a side view as viewed in a direction perpendicular to the optical axis.

FIG. 6 shows a table illustrating results of the judgment and respective RMS values of optical members.

FIG. 11 illustrates the measurement of the wave front aberration for an optical member based on the oil-on-plate method, wherein

FIG. 12 illustrates a state in which the optical member is rotated in the direction of the arrow to measure the wave front aberration, wherein

FIG. 13 illustrates a state in which the optical member is moved in a direction perpendicular to the optical axis to measure the wave front aberration, wherein

DESCRIPTION OF THE PREFERRED EMBODIMENTS OF THE INVENTION

Figure 1A:
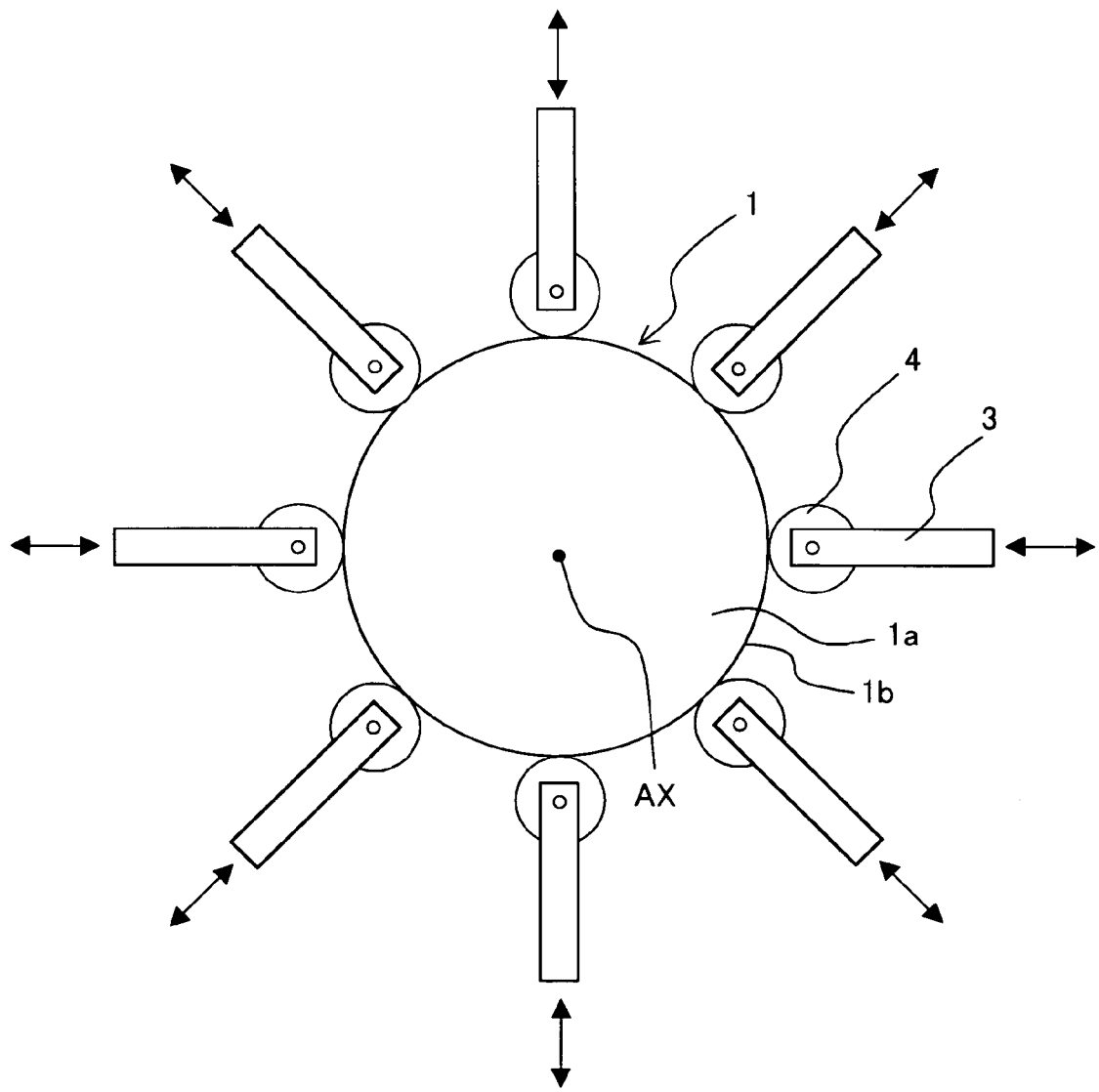

The evaluation method of the present invention will be specifically explained below. However, the present invention is not limited thereto.

At first, a starting material is synthesized to obtain an ingot. Those usable as the material include, for example, synthetic silica glass, fluorine-doped silica glass, calcium fluoride, barium fluoride, and other crystalline materials. The synthesizing method differs depending on the type of the material. Therefore, the synthesis is performed in accordance with a method suitable for each of the materials. An optical member for the photolithography is cut out from the synthesized ingot. The optical member has a diameter of 400 mm and a thickness of 60 mm, to which the grinding or polishing process is applied so that the upper surface and the lower surface are flat surfaces.

The wave front aberration of the optical member is measured by using a vertical type Fizeau interferometer for measuring the flat surface optical member based on the use of a light source of a He—Ne laser having a wavelength of 633 nm. The side surface of the optical member is retained at a plurality of positions disposed at equal intervals so that the surface, through which the laser beam comes into the optical member, is held in a horizontal state. The optical member is positioned between two parallel flat plates. The gaps between the optical member and the two parallel flat plates are filled with an oil. The type of the oil is selected so that the refractive index of the oil is approximately the same as the refractive index of the optical member. The wave front aberration is measured in accordance with the oil-on-plate method. The principle of this method has been already explained.

A specified example of the method for retaining the side surface of the optical member will be explained with reference to FIGS. 1A and 1B. The illustrated optical member 1 is columnar. The optical member 1 has the optical axis AX which is positioned at the center of rotation of the circular plate and which extends in a direction perpendicular to the sheet surface of the drawing. The surface, into which the light beam comes when the optical member 1 is actually used, is the surface (upper surface or bottom surface) 1a parallel to the sheet surface of the drawing. The surface, on which the optical member 1 is retained by elastic members 4, is the side surface (side surface with respect to the optical axis) which is designated when the optical axis AX is the center of rotation. The surface corresponds to the outer circumferential surface when the optical member is a columnar or circular plate-shaped member.

Figure 1B:
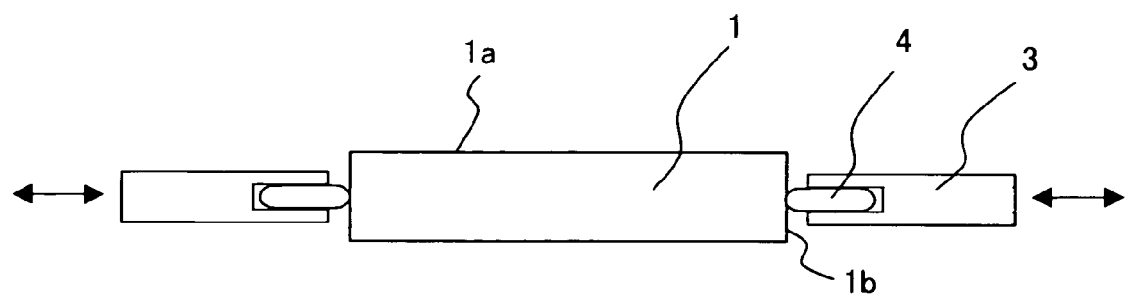

As shown in FIGS. 1A and 1B, a plurality of rods 3, which are provided with the elastic members 4 attached to the tips, are used to apply the load at eight positions of the side surface 1b of the optical member. The frictional force, which is generated thereby, is utilized to retain the optical member 1. The rods 3 are arranged at equal intervals along the side surface of the optical member. It is desirable that the loads are directed approximately to the center of the optical member, i.e., the optical axis AX. The rods 3 are operated in the radial directions (direction of the arrows in the drawing) of the optical member 1 in accordance with the action of unillustrated actuators to retain and release the optical member 1. The actuators may be composed of, for example, eight air cylinders having an identical volume and pistons. In this arrangement, the respective rods 3 serve as the pistons respectively. The air cylinders, which effect the sliding movement of the respective pistons, can be connected to a common pressure piping via a manifold. When a predetermined gas pressure is supplied to the pressure piping, the elastic members are moved by the aid of the pistons. Therefore, it is possible to apply the uniform urging force to the eight points of the optical member at which the optical member makes contact with the elastic members 4. Those usable as the elastic member 4 include a ring-shaped member formed with, for example, fluorine-based rubber and silicon rubber. A plurality of the ring-shaped members as described above can be used while superimposing them in the optical axis direction so that the urging force is not concentrated on one point.

The eight rods 3 are used in FIG. 1. However, the number of the rods is desirably not less than 4, more desirably not less than 8, and much more desirably not less than 12. FIG. 2 shows an example in which the side surface of the optical member is retained at twelve positions by using the twelve rods 3 to which the elastic members are attached.

The wave front aberration is measured by retaining the optical member as described above. In this procedure, a square area, which has an inscribing circle of the outer circumference of the optical member (when the optical member is columnar), is divided into elements of not less than about 50×50 meshes, and the value of the wave front aberration is measured for each of the elements. The number of the elements (number of the measuring points) is determined depending on the size of the optical member as the measurement objective and the light flux diameter (partial diameter).

Figure 8:
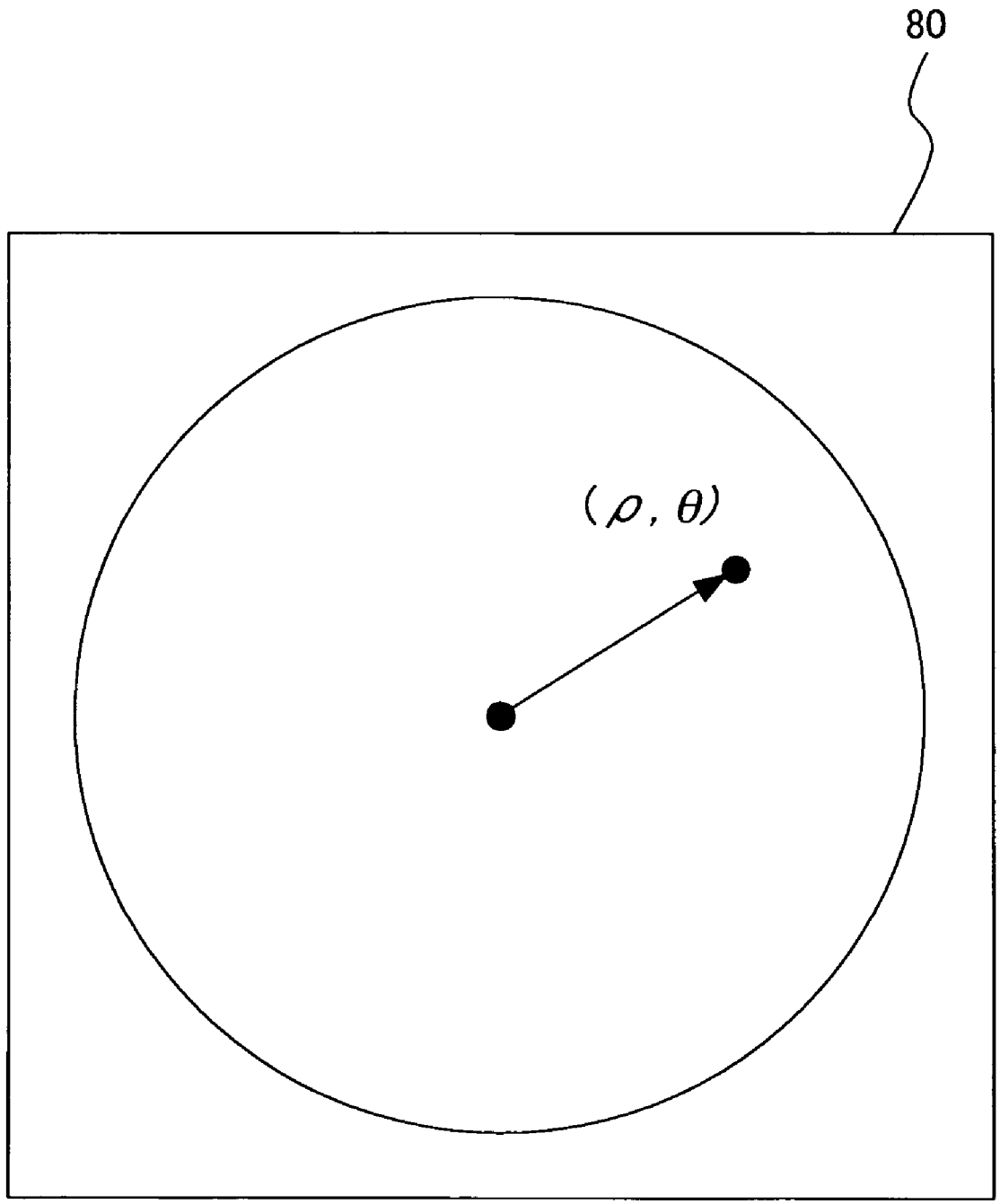
FIG. 8 conceptually shows the coordinate system for expressing the measured wave front aberration data.
Figure 9:
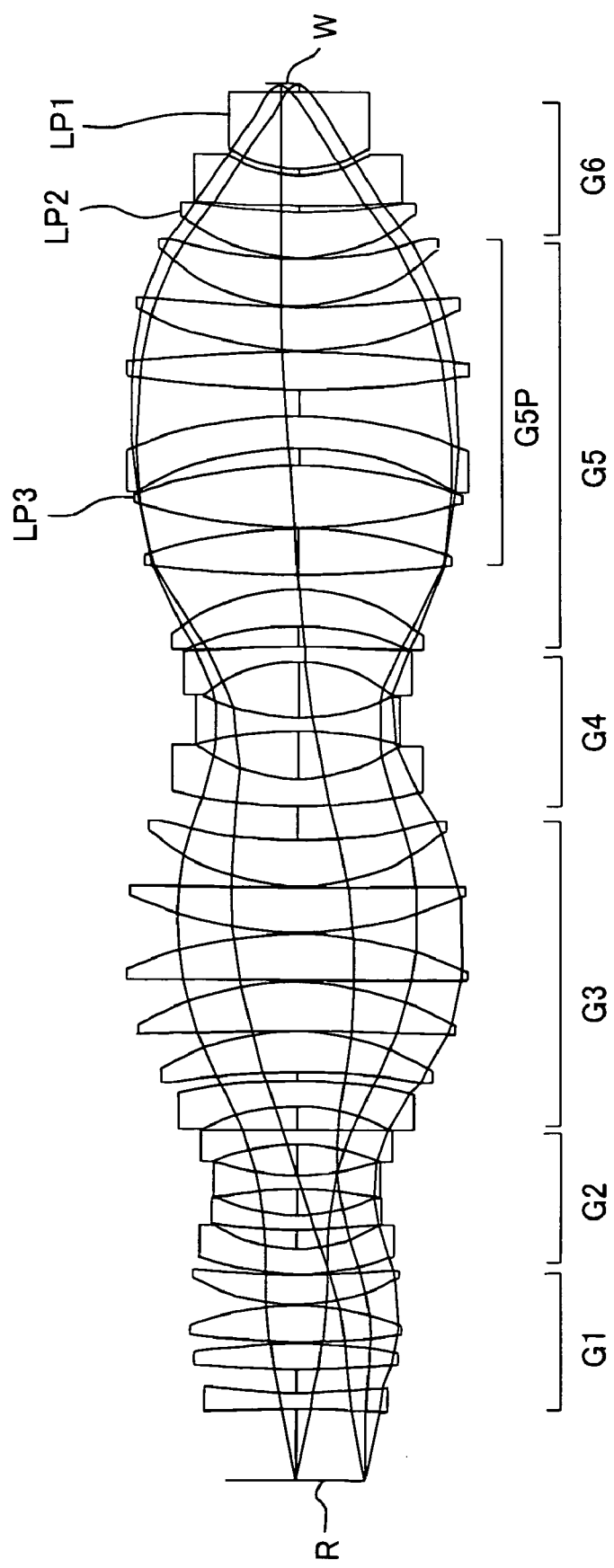
FIG. 9 conceptually shows the light flux diameters and the projection optical system for the excimer laser stepper.
Figure 10:
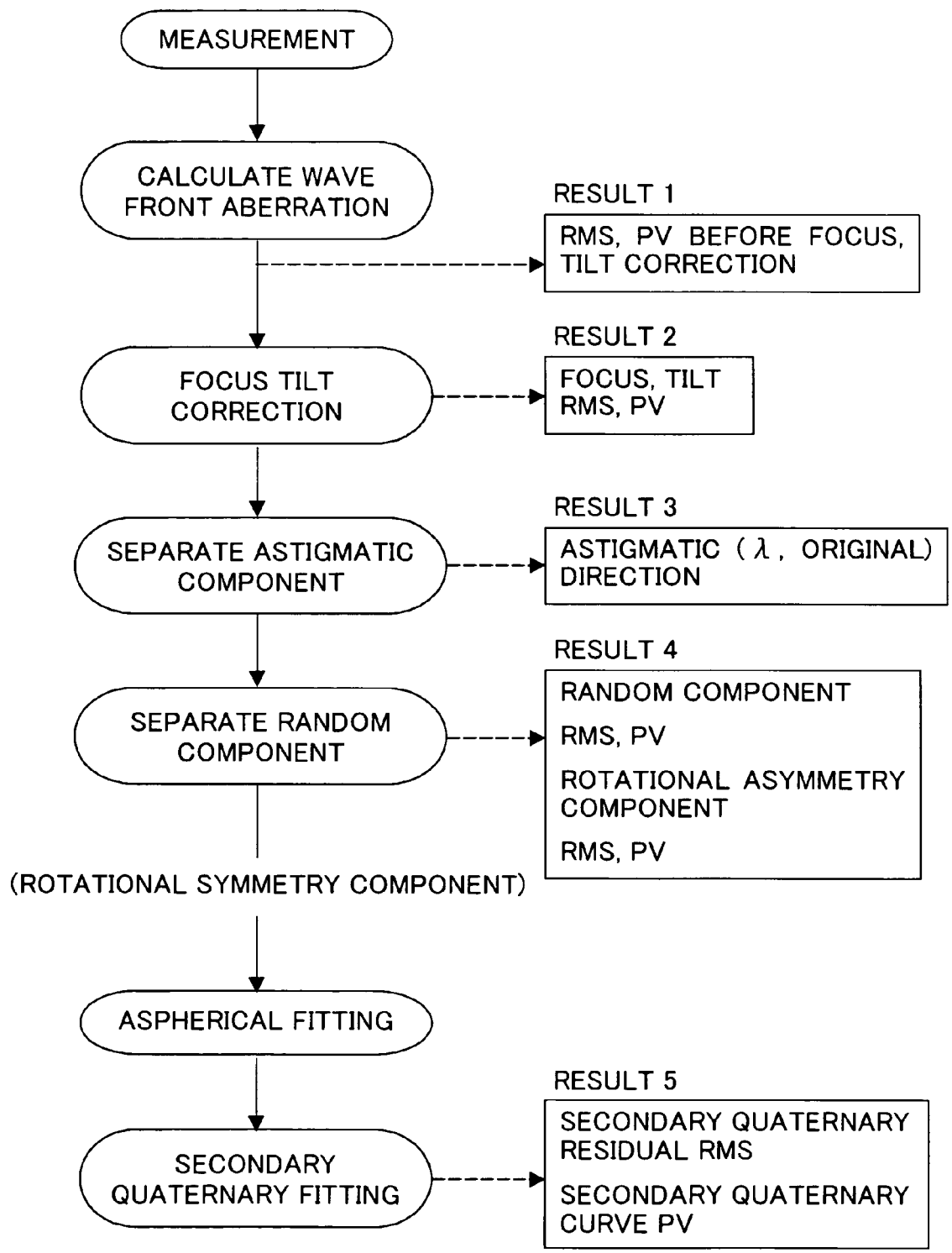
FIG. 10 shows a flow chart illustrating a method for evaluating the refractive index homogeneity of an optical member for the photolithography having been hitherto carried out.

The measured wave front aberration data is dealt with as having been explained above. That is, as shown in FIG. 8, the coordinate system is defined on the outgoing pupil surface 80 of the optical member, and the obtained wave front aberration is expressed by using the coordinate system. That is, the polar coordinates are defined on the outgoing pupil plane, and the obtained wave front aberration W is expressed as W ($\rho$, $\theta$).

Figure 7:
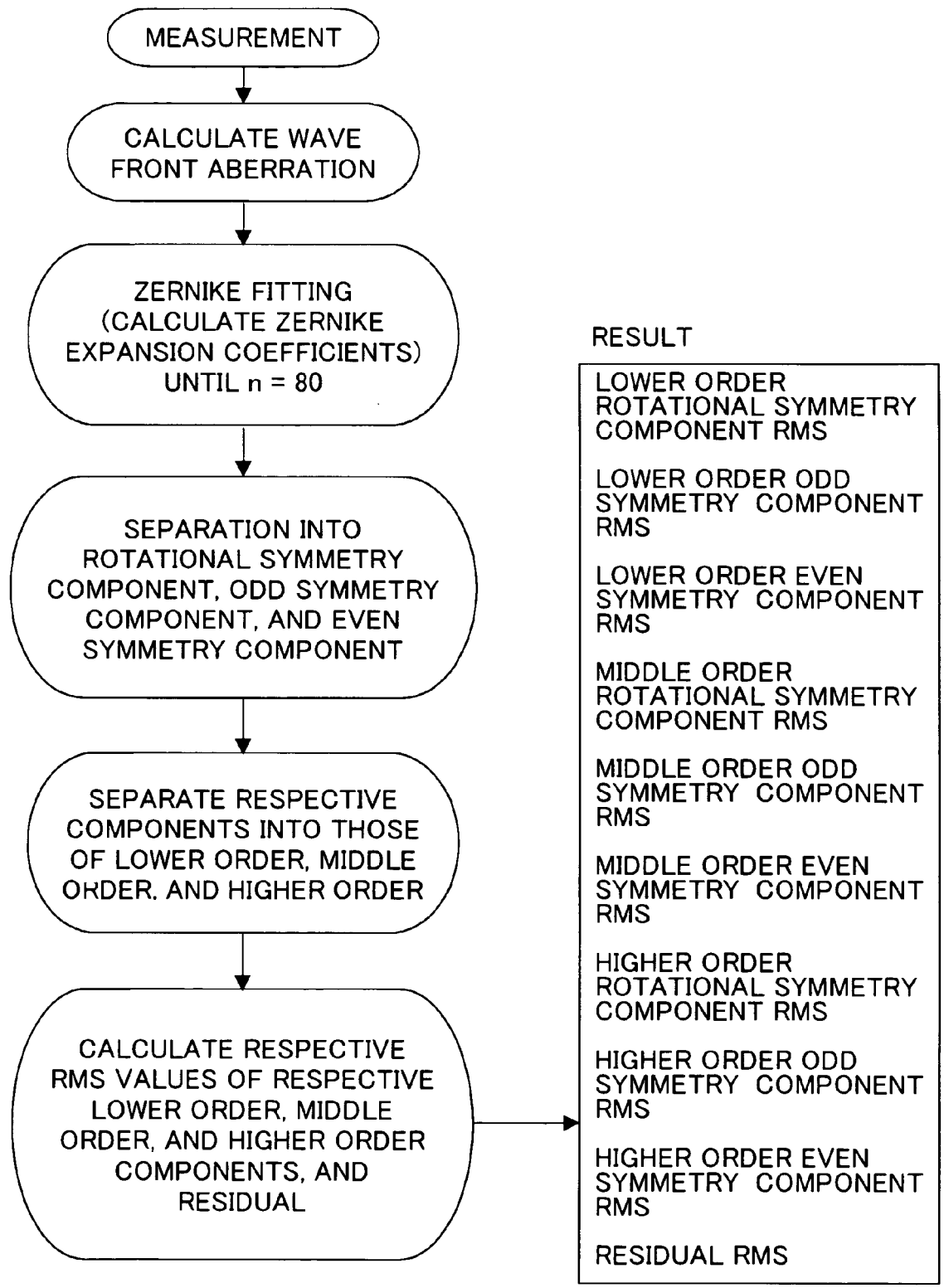
FIG. 7 shows a flow chart illustrating a method for evaluating the refractive index homogeneity of the optical member for the photolithography by the fitting based on the Zernike cylindrical function.

Subsequently, the wave front aberration W is expanded into the orthogonal function system. In the present invention, in order to separate the wave front aberration into the rotational symmetry component, the odd symmetry component, and the even symmetry component about the center of the pupil of the optical member, the Zernike cylindrical function is used as the orthogonal function system. A series of procedures are shown in FIG. 7. In this procedure, $\rho$ represents the normalized pupil radius obtained by normalizing the radius of the outgoing pupil to 1, and $\theta$ represents the radial angle of the polar coordinate. That is, the wave front aberration W ($\rho$, $\theta$) is expanded by using the Zernike cylindrical function system Zn ($\rho$, $\theta$) as follows.

$$W(\rho, \theta) = \Sigma C_n Z_n(\rho, \theta) \tag{4}$$

In this expression, Cn represents the expansion coefficient. When the expansion is made until arrival at a larger value of n, the fitting can be achieved more accurately. However, if n is too large, the load on the calculation is increased. Therefore, it is desirable to use an appropriate size or magnitude. In view of the above, it is appropriate to give n=0 to 35 or 0 to 80. In the case of n=0 to 35, the fitting can be achieved until the 10th order coefficient. In the case of n=0 to 80, the fitting can be achieved until the 16th order coefficient.

Subsequently, the respective terms of the expression (1) are separated into those of the three types of:

(a) the term not including $\theta$, i.e., the rotational symmetry component in which the value at certain coordinates is equal to the value at coordinates obtained by rotating the certain coordinates by an arbitrary angle about the center of the pupil;

(b) the term including the trigonometric function of an odd number multiple of the radial angle $\theta$ such as sin (or cos) $\theta$ and sin (or cos) 3$\theta$, i.e., the odd symmetry component in which the value at certain coordinate is equal to the value at coordinates obtained by rotating the certain coordinates by 360° divided by odd number about the center of the pupil; and (c) the term including the trigonometric function of an even number multiple of the radial angle $\theta$ such as sin (or cos) 2$\theta$ and sin (or cos) 4$\theta$, i.e., the even symmetry component in which the value at certain coordinate is equal to the value at coordinates obtained by rotating the certain coordinates by 360° divided by even number about the center of the pupil. That is, the following expressions are obtained assuming that the rotational symmetry component, the odd symmetry component, and the even symmetry component of the wave front aberration are designated as $W_{rot}$, $W_{odd}$, and $W_{evn}$.

$$W_{rot}(\rho, \theta) = C_0 + C_3 Z_3 + C_8 Z_8 + C_{15} Z_{15} + C_{24} Z_{24+} \ldots \tag{5}$$

$$W_{odd}(\rho, \theta) = C_1 Z_1 + C_2 Z_2 + C_6 Z_6 + C_7 Z_7 + C_9 Z_9 + C_{10} Z_{10} + \ldots \tag{6}$$

$$W_{evn}(\rho, \theta) = C_4 Z_4 + C_5 Z_5 + C_{11} Z_{11} + C_{12} Z_{12} + C_{16} Z_{16} + \ldots \tag{7}$$

Further, it is assumed that $r_w$ represents the RMS value (root mean square) of the wave front aberration in the expression (4), $r_{rot}$ represents the RMS value of the rotational symmetry component $W_{rot}$ of the wave front aberration in the expression (5), $r_{odd}$ represents the RMS value of the odd symmetry component $W_{odd}$ in the expression (6), and $r_{evn}$ represents the RMS value of the even symmetry component $W_{evn}$ of the wave front aberration in the expression (7). The following relationship holds among $r_w$, $r_{rot}$, $r_{odd}$, and $r_{evn}$.

$$(r_w)^2 = (r_{rot})^2 + (r_{odd})^2 + (r_{evn})^2$$

$r_{rot}$, $r_{odd}$, and $r_{evn}$ can be correlated to the spherical aberration component, the comatic aberration component, and the astigmatic aberration component of the refractive index distribution of the optical member respectively.

It is now assumed that the optical members are processed into lenses which are combined to construct an optical system. The aberration of the component having a relatively small n, i.e., the component having the lower order is easily reduced by changing the spacing distance between the lenses and/or shifting, inclining, or rotating a part of the lenses about the optical axis. The aberration component having the order of n larger than the above becomes to be more difficult to be reduced. However, the aberration component can be reduced to some extent by rotating the lens and/or changing the combination of the lenses. When the aberration component cannot be reduced by the method as described above, the aberration component can be reduced by correcting the surface shapes of a part of the lenses. However, as for the aberration component of the order of n larger than the above, it is difficult to reduce the aberration component.

According to the study performed by the inventors, the aberration can be removed in relation to the component having a small n, for example, the component having an n=0 to 3. Therefore, it is considered that no problem arises even when such a component is excluded from the evaluation objective. As for the components having n's of not less than 4, when the aberration component is evaluated by making division into a plurality of areas depending on the size of n, it is possible to reasonably evaluate the refractive index homogeneity of the optical member. For example, when the aberration components are evaluated by making division into three areas in which the components of n=4 to 8 have the lower order, the components of n=9 to 35 have the middle order, and the components of n>35 have the higher order, it is possible to reasonably evaluate the refractive index homogeneity of the optical member.

Accordingly, $W_{rot}$, $W_{odd}$, and $W_{evn}$ are divided into those of the lower order (n=4 to 8), the middle order (n=9 to 35), and the higher order (n>35) respectively. The RMS values of the wave front aberration components are defined as "lower order $r_{rot}$, lower order $r_{odd}$, lower order $r_{evn}$, middle order $r_{rot}$, middle order $r_{odd}$, middle order $r_{evn}$, higher order $r_{rot}$, higher order $r_{odd}$, and higher order $r_{evn}$" respectively. The wave front aberration components, which remain as a result of the unsuccessful or incomplete fitting, are defined as "residual". The RMS value and the PV value of the residual are defined as "residual RMS" and "residual PV".

When the fitting is performed for n=0 to 35, then the higher order $r_{rot}$, the higher order $r_{odd}$, and the higher order $r_{evn}$ are not defined, and the wave front aberration components, which remain as a result of the unsuccessful or incomplete fitting in relation to the respective terms of the lower order and the middle order, are defined as "higher order residual". The RMS value and the PV value of the higher order residual are referred to as "higher order residual RMS" and "higher order residual PV".

In the foregoing expression, the wave front aberration is firstly separated into the rotational symmetry component, the odd rotational symmetry component, and the even rotational symmetry component, and then the respective components are separated into those of the lower order, the middle order, and the higher order depending on the orders. However, the sequence of the procedure may be reversed. That is, exactly the same result is obtained even when the wave front aberration is firstly separated into the components of the lower order, the middle order, and the higher order depending on the orders, and then each of the components is separated into the rotational symmetry component, the odd rotational symmetry component, and the even rotational symmetry component. When the wave front aberration of the optical member is divided into the plurality of component to make the evaluation in accordance with the Zernike fitting as described above, it is possible to evaluate the refractive index homogeneity highly accurately.

Figure 2A:
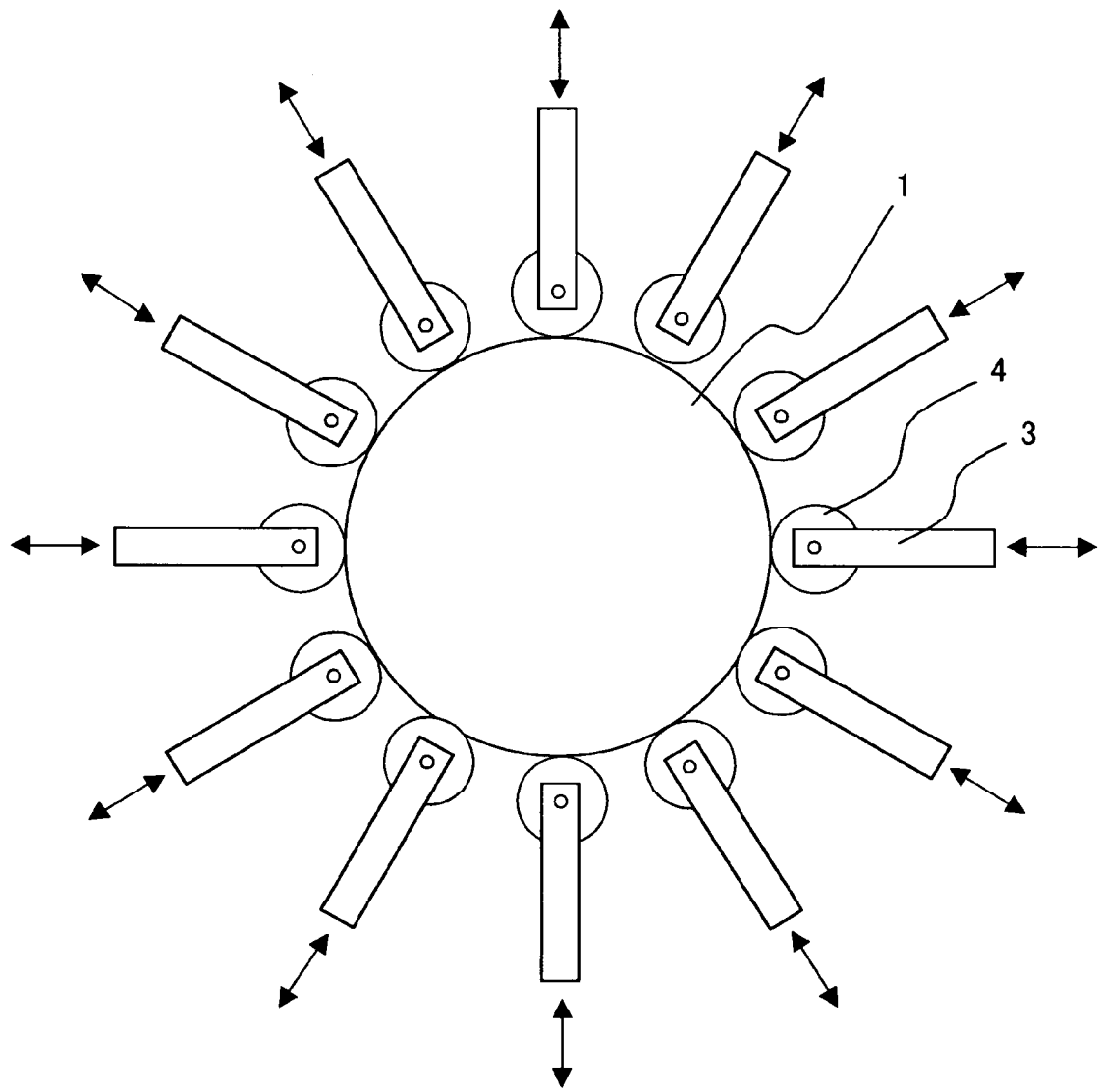
Figure 2B:
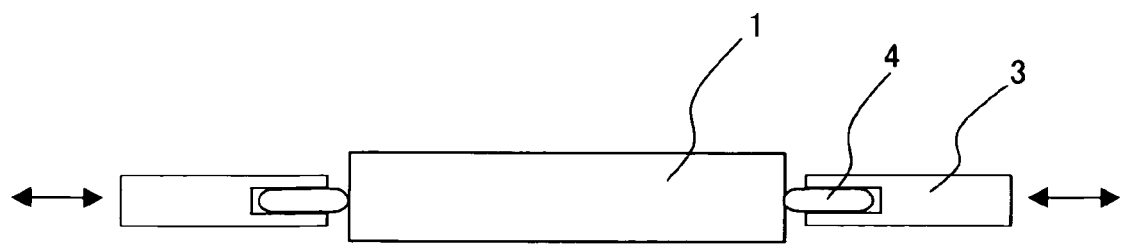
Figure 14:
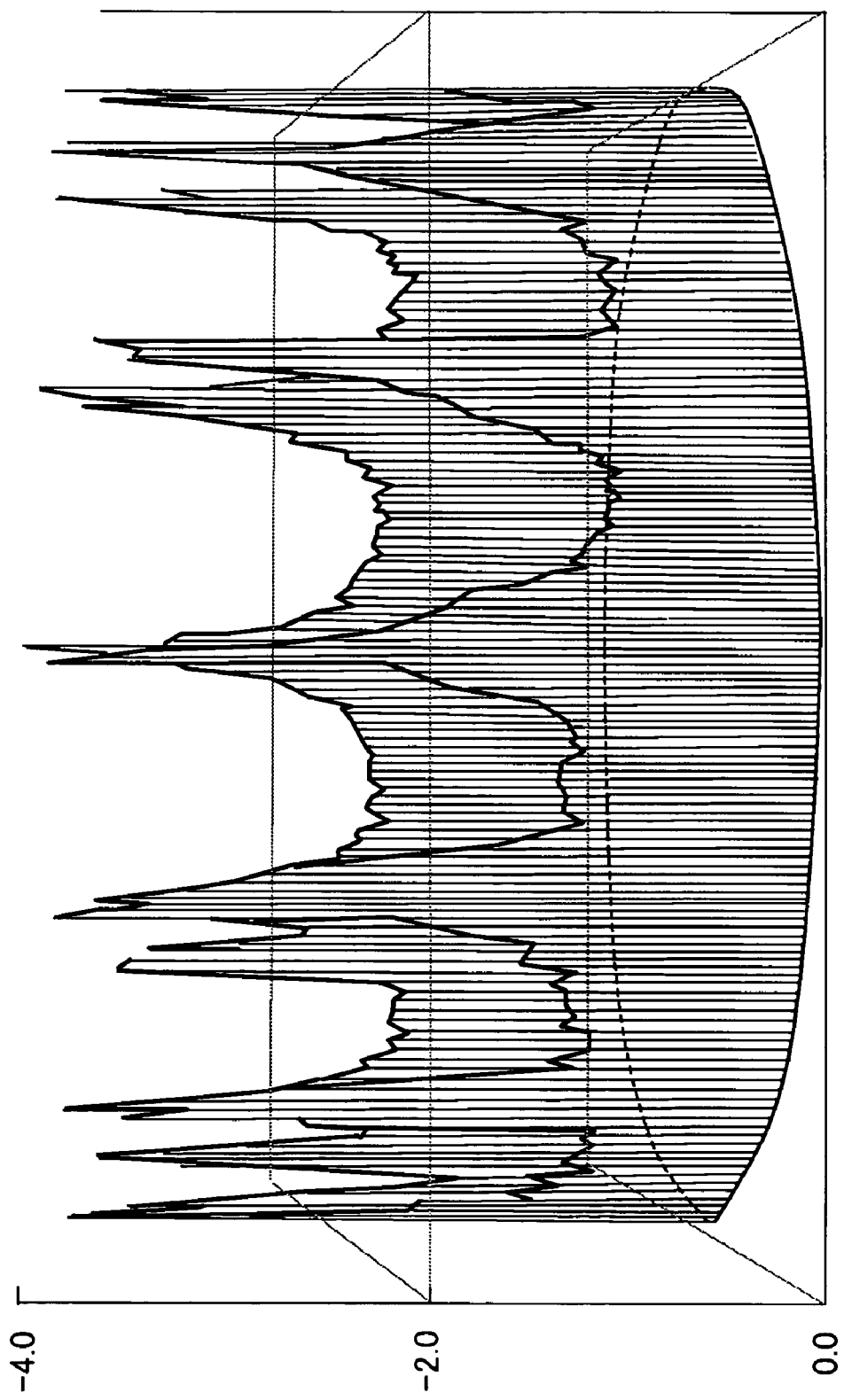
FIG. 14 conceptually shows the stress strain distribution generated when the optical member is retained at 12 positions of the side surface.

As having been already explained, the optical member is retained at a plurality of positions disposed at equal intervals on the side surface. In order to retain the optical member, the load is applied thereto. Therefore, the stress strain is generated at the retaining portions of the optical member. FIG. 14 shows an example of the measurement of the stress strain. In this example, the strain is measured when the optical member is retained at twelve positions on the side surface in accordance with the retaining method as shown in FIGS. 2A and 2B (the driving pressure of the air supplied to the common piping connected to the rods: 0.1 MPa, the size of the optical member: $\phi 302 \times 52t$). As understood from the drawing, the stress strain is generated at the twelve portions at which the optical member is retained (average value of strain: $-3.50$, standard deviation: 0.09, strain width of twelve points: 0.35). The stress strain as described above inhibits the correct evaluation of the refractive index homogeneity, because the stress strain is not inherent in the optical member.

Accordingly, in order to measure the wave front aberration of the measurement objective more highly accurately, i.e., in order to evaluate the refractive index homogeneity highly accurately, the inventors have employed the method as explained below. At first, the optical member as the measurement objective is set to the vertical type Fizeau interferometer to determine the wave front aberration data in accordance with the oil-in-plate method.

Figure 12A:
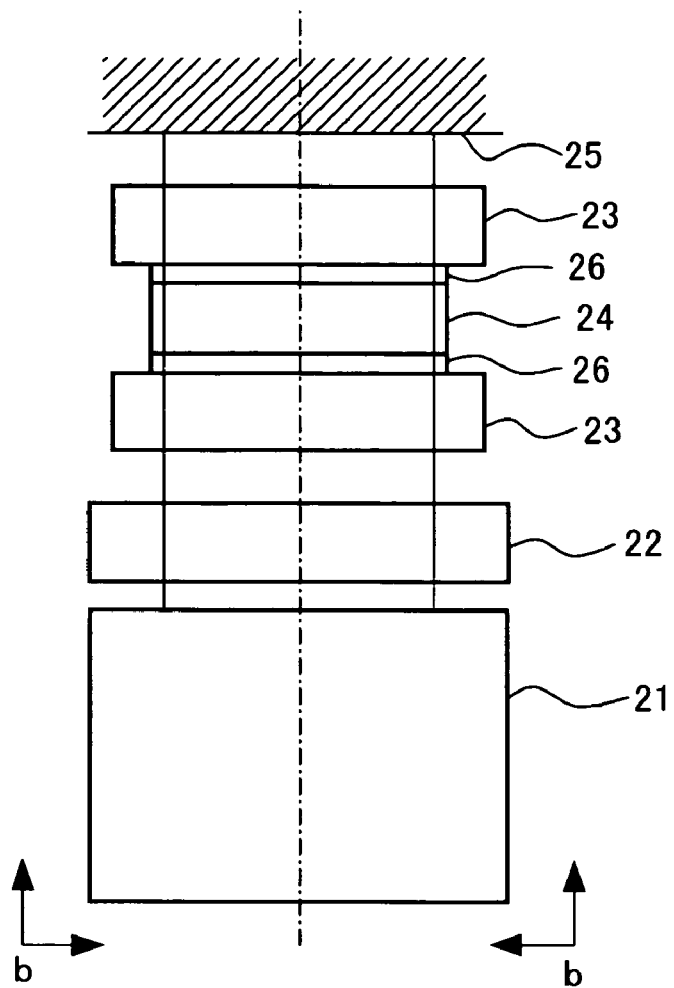
FIG. 12A shows a state as viewed in the direction perpendicular to the optical axis of the optical member.
Figure 12B:
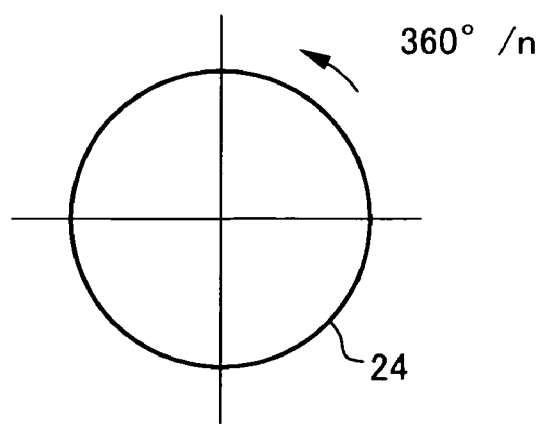
FIG. 12B shows the optical member as viewed in the direction of the line b-b shown in FIG. 12A.

Subsequently, as shown in FIG. 12B, the optical member 24 is rotated in the direction of the arrow about the center of the optical axis to measure the wave front aberration at every predetermined angle of rotation. The predetermined angle of rotation is the angle which is an integral multiple of the angle between the adjoining retaining positions of the optical member. Subsequently, the data, which is obtained by averaging respective pieces of the measured wave front aberration data, is subtracted from the wave front aberration data having been measured before rotating the optical member. Accordingly, it is possible to determine the rotational asymmetry component included in the rotational symmetry component and the rotational asymmetry component for constructing the wave front aberration inherent in the optical member. Simultaneously, it is also possible to cancel the influence on the wave front aberration data caused by the stress strain generated by the retention of the optical member.

Figure 13A:
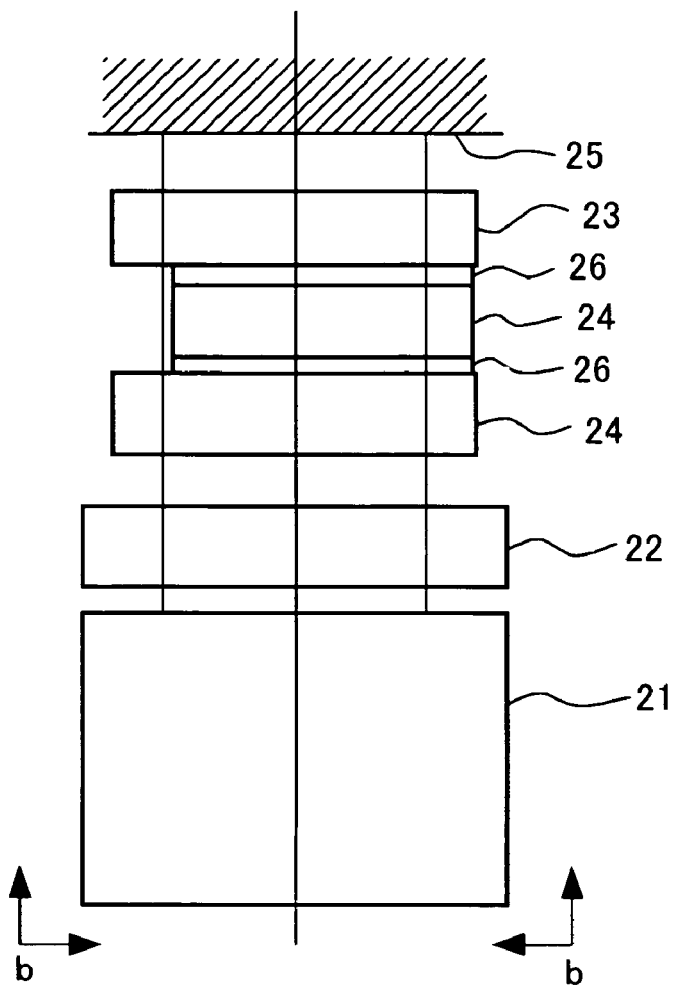
FIG. 13A shows a state as viewed in the direction perpendicular to the optical axis of the optical member.
Figure 13B:
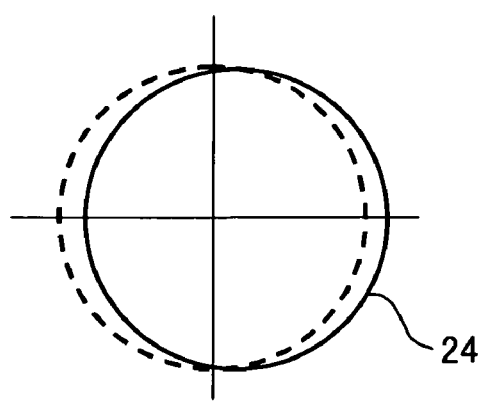
FIG. 13B shows the optical member as viewed in the direction of the line b-b shown in FIG. 13A.

Subsequently, as shown in FIGS. 13A and 13B, the wave front aberration data is shifted in a state in which the optical member 24 is deviated in the direction perpendicular to the optical axis from the state shown in FIGS. 12A and 12B, which is subtracted from the wave front aberration data having been measured before the shift. Accordingly, it is possible to determine the rotational symmetry component included in the rotational symmetry component and the rotational asymmetry component for constructing the wave front aberration inherent in the optical member. The wave front aberration, which is inherent in the optical member, is determined by adding the rotational symmetry component and the rotational asymmetry component determined as described above. The period of time, which is required to rotate and shift the optical member, is short. Therefore, it is considered that the change of the state of the interferometer and the oil during this period is approximately almost negligible. Therefore, according to the method as described above, it is possible to measure the wave front aberration more accurately.

An explanation will be made below about the calculation process according to the principle of the measurement of the wave front aberration of the optical member as described above. At first, the wave front aberration W, which depends on the internal homogeneity of the optical member, is classified with the constitutive components. When the rotational symmetry component is designated as Ws, and the rotational asymmetry component (total of the odd rotational symmetry component, the even rotational symmetry component, and the residual) is designated as Wa, then the following expression is obtained.

$$W = Ws + Wa \quad (8)$$

As shown in FIG. 12B, respective pieces of the wave front aberration data, which are measured at respective angles while rotating the optical member by every 360°/n, are designated as Dw(1), Dw(2), ... Dw(n), and the wave front aberrations (internal homogeneity) of the optical member at the respective angles are designated as W(1), W(2), ... W(n).

The rotational symmetry component is defined as the following expression (9).

$$Ws = \Sigma W(i)/n \quad (9)$$

The value of the rotational asymmetry component, which is averaged over the rotation, is zero. This fact is described below. That is, according to the expression (8), the following expression holds.

$$W(i) = Ws + Wa(i) \quad (10)$$

Therefore, the following expression holds.

$$\Sigma W(i)/n = \Sigma Ws/n + \Sigma Wa(i)/n$$

When the terms are moved, the following expression is obtained.

$$\Sigma Wa(i)/n = \Sigma W(i)/n - \Sigma Ws/n = Ws - Ws = 0$$

That is, it is proved that the value of the rotational asymmetry component, which is averaged over the rotation, is zero. As for the rotation averaged data, the following expression (11) is obtained according to the definition of the expression (9) assuming that S represents the wave front aberration of the parallel flat plate, K represents the wave front aberration of the measuring optical system of the interferometer including the oil, and M represents the wave front aberration of the reflecting surface.

$$\Sigma Dw(i)/n = \Sigma W(i)/n + S + K + M = Ws + E + O \quad (11)$$

In the right side of the expression (11), the wave front aberration is divided into the component E originating from the interferometer and the component O originating from the oil by using the expression (1). According to the expression (10), the wave front aberration data Dw(1) of the optical member in the direction of 0° is expressed as the following expression (12).

$$Dw(1) = W(1) + S + K + M = Ws + Wa(1) + E + O \quad (12)$$

Therefore, when the rotation averaged data of the expression (11) is subtracted from the expression (12), the following expression (12') is obtained.

$$Dw(1) - \Sigma D(i)/n = Wa(1) \quad (12')$$

Thus, the rotational asymmetry component Wa is obtained.

Subsequently, the following expression (13) holds assuming that Dw(x) represents the wave front aberration data when the optical member is laterally shifted as shown in FIGS. 13A and 13B, Ws(x) represents the rotational symmetry component of the internal homogeneity of the optical member in this situation, and Ws(x) represents the rotational asymmetry component.

$$Dw(x) = Ws(x) + Wa(x) + E + O \quad (13)$$

When the wave front aberration data Dw(x) is subtracted from the wave front aberration data Dw(1) in the direction of 0° (state not subjected to the shift), the following expression (14) is obtained according to the expressions (12) and (13).

$$Dw(1) - Dw(x) = (Ws + Wa) - (Ws(x) + Wa(x)) \quad (14)$$

It is noted that Wa is known, and Wa(x) is also known, because Wa(x) is determined based thereon. When the unknown terms are moved to the left side, and the terms of the measurement data are moved to the right side, then the following expression (15) is obtained.

$$Ws - Ws(x) = Dw(1) - Dw(x) - (Wa - Wa(x)) \quad (15)$$

This expresses the data obtained by laterally shifting and superimposing the rotational symmetry component Ws. When the property, in which the contour lines of the rotational symmetry component are distributed concentrically, is utilized, Ws(x) is determined. Therefore, when this term is also moved to the right side, the following expression (16) is obtained.

$$Ws = Dw(1) - Dw(x) - (Wa - Wa(x)) + Ws(x) \quad (16)$$

Thus, the rotational symmetry component Ws is determined. That is, the wave front aberration (internal homogeneity), which is inherent in the optical member, is determined, because the data structure of the wave front aberration inherent in the optical member is as shown in the expression (8).

As having been already explained, in relation to the angle of rotation adopted when the wave front data is obtained by rotating the optical member, the angle of rotation relates to the number of positions at which the optical member is retained. For example, when the side surface (outer circumference) of the optical member is equivalently retained at twelve position, the angle between the adjoining retaining positions is 30°. Therefore, it is necessary that the angle of rotation is an integral multiple thereof, i.e., an angle such as 30°, 60°, and 90° ... As for the number of the operations of the rotation and the measurement, the measurement accuracy is high in principle when the number is large. On the contrary, the period of time, which is required for the measurement, is prolonged, and the possibility of the change of the state of the interferometer and the oil is increased. Therefore, in such a situation, any factor arises to lower the measurement accuracy. Therefore, when the measurement is actually performed, it is considered that the number of 3 to 4 is appropriate. When it is intended to perform the measurement in a short period of time, it is also possible that the number is 2. In this case, it is not necessarily indispensable that the angle of rotation is in a diagonal relationship (for example, 0° and 180°). For example, it is also allowable to use a combination of 0° and 60°.

As for the amount of the lateral shift of the optical member, the measurement accuracy is increased in principle when the amount is large. On the contrary, it is also feared that the retaining state of the optical member or the like is changed, and the measurement accuracy is lowered. Therefore, it is necessary that the amount of the lateral shift is not too large. It is considered that the amount of the lateral shift is appropriately about 10% of the diameter of the optical member.

The wave front aberration determined as described above is expanded with respect to the orthogonal function system such as the Zernike cylindrical function as having been already explained. The method of the present invention will be explained more specifically below as exemplified by Examples.

EXAMPLE 1

A silica glass ingot having a diameter of 500 mm and a length of 800 mm was produced in accordance with the direct method, and a circular plate-shaped test piece is cut out horizontally from the ingot. In this procedure, the center of rotation of the ingot is made to be coincident with the center of the circular plate. In order to remove the strain from the test piece and adjust the homogeneity, the test piece is set to the central portion of an annealing furnace having a temperature distribution of centro-symmetry to perform an annealing treatment while rotating the test piece. As for the annealing treatment condition, a temperature of 1,000° C. is maintained for 24 hours, and the temperature is lowered to 500° C. at a temperature gradient of −10° C./minute, followed by being left to stand and cooled. Subsequently, an optical member having a circular plate-shaped configuration with a diameter of 300 mm and a thickness of 60 mm is extracted from the test piece by using a core drill, and the upper and lower surfaces are polished. In this procedure, the center of rotation of the ingot is made to be coincident with the center of the circular plate. In order to evaluate the refractive index homogeneity of the optical member, it is firstly necessary to know the inclination component of the refractive index, for the following reason. That is, it is difficult to directly measure the inclination component of the refractive index by using the interferometer. Accordingly, two prism-shaped samples are sampled from both ends of the member in the diametral direction, and the refractive index is measured at an accuracy of $10^{-7}$ order in accordance with the minimum angle of deviation method by using a highly accurate spectrometer. In this case, the difference in the refractive index between the two samples was not more than the measurement limit, i.e., not more than $10^{-7}$. According to this fact, it is appreciated that the center of rotation of the circular plate-shaped sample is approximately in parallel to the optical axis (approximately coincident with the optical axis).

Subsequently, a vertical type Fizeau interferometer is prepared to measure the flat surface optical member by using a light source of a He—Ne laser having a wavelength of 633 nm. At first, two circular plate-shaped parallel flat plates are set close to each other to the interferometer. The gap therebetween is filled with an oil which has approximately the same refractive index as the refractive index of the optical member to be measured. The parallel flat plate had a diameter of 460 mm and a thickness of 70 mm, for which silica glass was used, the silica glass having a surface disposed on the side opposite to the side of the arrangement of the measurement objective, and the surface being formed with a multilayer film of $MgF_2/Al_2O_3$ (alternatively $SiO_2/Al_2O_3$). In this state, the first wave front aberration data is measured for measuring points (ρ, θ) of 100×100 meshes.

Subsequently, the optical member was arranged between the two parallel flat plates substantially in parallel to the parallel flat plates. The gaps between the optical member and the parallel flat plates on the upper and lower sides were filled with the oil. In this procedure, as shown in FIG. 1, the optical member was retained by generating the frictional force by applying the load by the aid of elastic members 4 provided for rods 3 at eight positions of the side surface 1b so that the surface of the optical member, into which the laser beam comes, is horizontal. In this arrangement, the respective rods 3 are accommodated in unillustrated air cylinders having identical inner diameters (not shown), and the eight air cylinders are connected to a common pressure piping (not shown) via a manifold (not shown). Therefore, the gas pressure, which is supplied to the common pressure piping, is supplied to the respective elastic members by the aid of the air cylinders. Therefore, the uniform urging force acts on the eight points of the optical member 1 at which the optical member 1 makes contact with the elastic members 4. In Example 1, the gas of 0.1 MPa was supplied to the common pressure piping.

In FIG. 1, the elastic members 4 are depicted in a simplified manner. However, the elastic member, which was used, was obtained such that commercially available two O-rings, each of which was made of fluorine-based rubber (or made of silicon-based rubber) having an inner diameter of 17.6 mm and a thickness of 2.4 mm, were superimposed in the direction of the axis of rotation.

In a state in which the optical member is uniformly retained by using the elastic members 4, the second wave front aberration data (21) is obtained for the measuring points (ρ, θ) of 100×100 meshes. The difference between the first wave front division (11) and the second wave front aberration data (21) is determined to calculate the third wave front aberration data (31). Before obtaining the second wave front aberration data (21), the operation is performed such that the optical member is rotated by a predetermined angle about the optical axis, and then the optical member is returned to the original position. Accordingly, it is also expected that any dispersion is reduced for the thickness and the density of the oil, and the measurement is performed more highly accurately. The angle of rotation is appropriately about 45 to 90°. The angle of rotation may be smaller or larger than the above depending on the situation. No problem arises even when the optical member is not returned to the original position after the rotation. The number of repetition of the rotational operations may be appropriately selected. It is desirable that the speed of rotation is approximately to such an extent that no bubble is caught by the oil. The speed of rotation may be appropriately determined depending on the size of the optical member and the viscosity of the oil.

Subsequently, the optical member is rotated by 45° while retaining the optical member, and the second wave front aberration data (22) is obtained in this state. The third wave front aberration data (32) is similarly obtained from the first wave front aberration data (11) and the second wave front aberration data (22). Subsequently, the optical member is further rotated by 45°, and the third wave front aberration data (33) is obtained in this state. This operation is repeated, and eight pieces in total of the wave front aberration data are obtained until the third wave front aberration data (38). Subsequently, the average value of the eight pieces of the wave front aberration data is subtracted from the third wave front aberration data (31) to separate the rotational asymmetry component Wa.

After that, the optical member is returned to the position before the rotation (position at which the first wave front aberration data has been measured). Starting from this state, the optical member is moved by 50 mm in the direction (lateral direction) perpendicular to the optical axis, and the second wave front aberration data (X) is obtained in this state. The wave front aberration data is subtracted from the first wave front aberration data (11) to separate the rotational symmetry component Ws.

The obtained rotational asymmetry component Wa is added to the rotational symmetry component Ws to determine the wave front aberration data W which is subjected to the fitting with respect to the Zernike cylindrical function system Zn ($\rho$, $\theta$) until the terms of n=0 to 80. That is, the expansion coefficients of $C_0$ to $C_{80}$ are determined from the plurality of pieces of the measurement data by the least squares method.

Subsequently, the determined expansion coefficients are substituted for the expression (1) to perform the calculation. Thus, W ($\rho$, $\theta$) is determined for each of the measuring points. The expressions (5) to (13) are substituted with the determined expansion coefficients to perform the calculation. Thus, the lower order $W_{rot}$, the lower order $W_{odd}$, the lower order $W_{evn}$, the middle order $W_{rot}$, the middle order $W_{odd}$, the middle order $W_{evn}$, the higher order $W_{rot}$, the higher order $W_{odd}$, and the higher order $W_{evn}$ are calculated for each of the measuring points. Further, these values are used to calculate the lower order $r_{rot}$, the lower order $r_{odd}$, the lower order $r_{evn}$, the middle order $r_{rot}$, the middle order $r_{odd}$, the middle order $r_{evn}$, the higher order $r_{rot}$, the higher order $r_{odd}$, and the higher order $r_{evn}$. Further, the difference between the actual measurement data and W ($\rho$, $\theta$) obtained by the calculation after the substitution for the expression (1) is determined for each of the measuring points to determine the residual thereby. These values are used to calculate the residual RMS value. The values of the respective components are as shown in FIG. 6. That is, the lower order $r_{rot}$ was 0.01 $\lambda$, the lower order $r_{odd}$ was 0.01 $\lambda$, the lower order $r_{evn}$ was 0.01 $\lambda$, the middle order $r_{rot}$ was 0.005 $\lambda$, the middle order $r_{odd}$ was 0.006 $\lambda$, the middle order $r_{evn}$ was 0.003 $\lambda$, the higher order $r_{rot}$ was 0.0015 $\lambda$, the higher order $r_{odd}$ was 0.0015 $\lambda$, the higher order $r_{evn}$ was 0.002 $\lambda$, and the residual RMS was 0.001 $\lambda$ with respect to the light source wavelength $\lambda$, respectively. The respective r values are considerably small. Therefore, it is understood that the refractive index homogeneity of the optical member is considerably excellent. As a result of the comparison of these values with the known reference values, it has been judged that the optical member is usable for the photolithography, especially for the lens of the projection optical system of the semiconductor exposure apparatus.

EXAMPLE 2

Figure 3A:
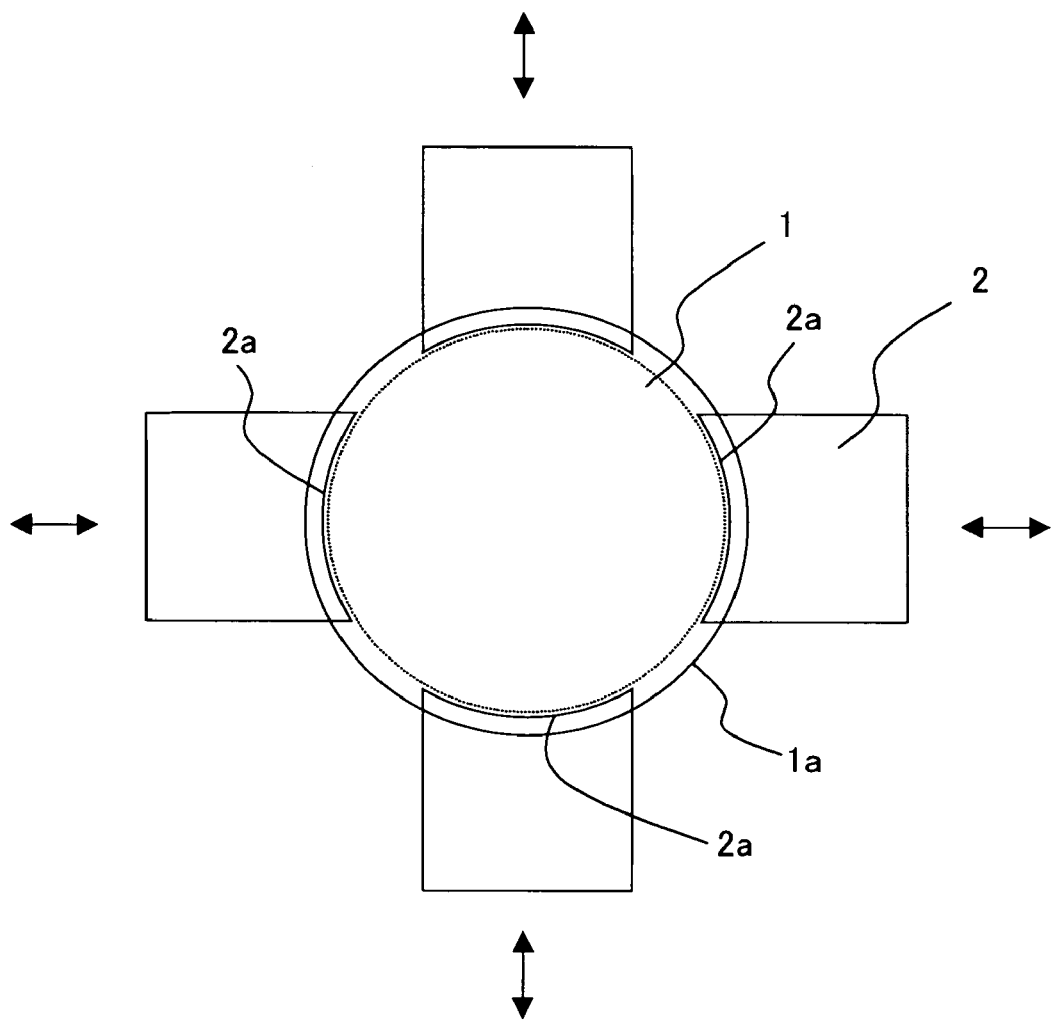
Figure 3B:
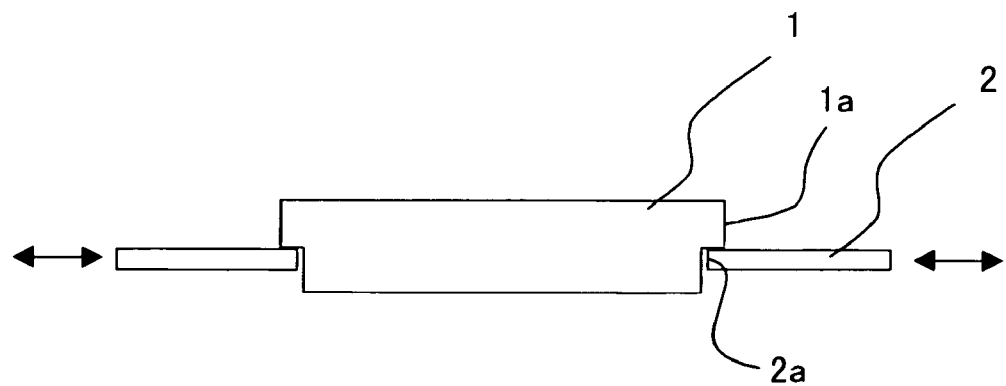

The same optical member as that used in Example 1 is set to the same vertical type Fizeau interferometer as that used in Example 1. The optical member was retained in the same manner as in Example 1 except that the optical member was supported at twelve points disposed at equal intervals in the circumferential direction of the optical member by using the twelve rods 5 as shown in FIGS. 3A and 3B.

The measurement of the wave front aberration data and the calculation process for the measured values were performed in the same manner as in Example 1. The values of the respective components are as shown in FIG. 6. That is, the lower order $r_{rot}$ was 0.008 $\lambda$, the lower order $r_{odd}$ was 0.008 $\lambda$, the lower order $r_{evn}$ was 0.009 $\lambda$, the middle order $r_{rot}$ was 0.004 $\lambda$, the middle order $r_{odd}$ was 0.005 $\lambda$, the middle order $r_{evn}$ was 0.002 $\lambda$, the higher order $r_{rot}$ was 0.0015 $\lambda$, the higher order $r_{odd}$ was 0.0015 $\lambda$, the higher order $r_{evn}$ was 0.001 $\lambda$, and the residual RMS was 0.0008 $\lambda$ with respect to the light source wavelength $\lambda$, respectively. The respective components have the values which are not more than those obtained in Example 1, probably for the following reason. That is, the uniformity of the retention is improved as compared with Example 1. As a result of the comparison of these values with the known reference values, it has been judged that the optical member is usable for the photolithography, especially for the lens of the projection optical system of the semiconductor exposure apparatus.

COMPARATIVE EXAMPLE 1

Figure 11A:
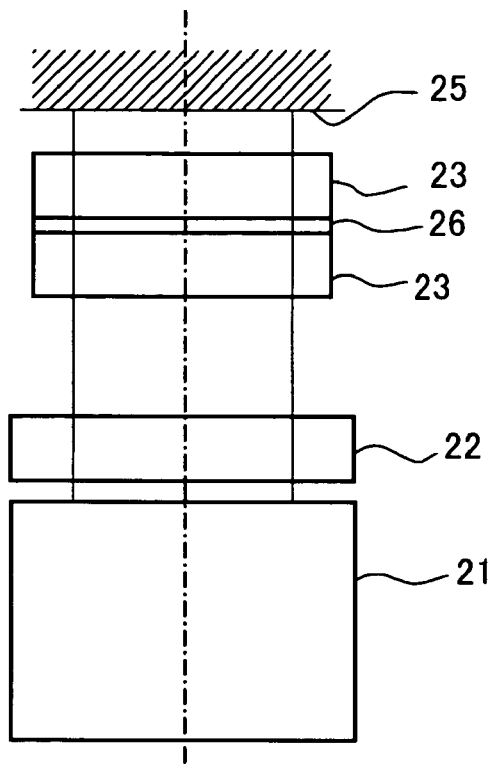
FIG. 11A illustrates a state in which the optical member is not set.
Figure 11B:
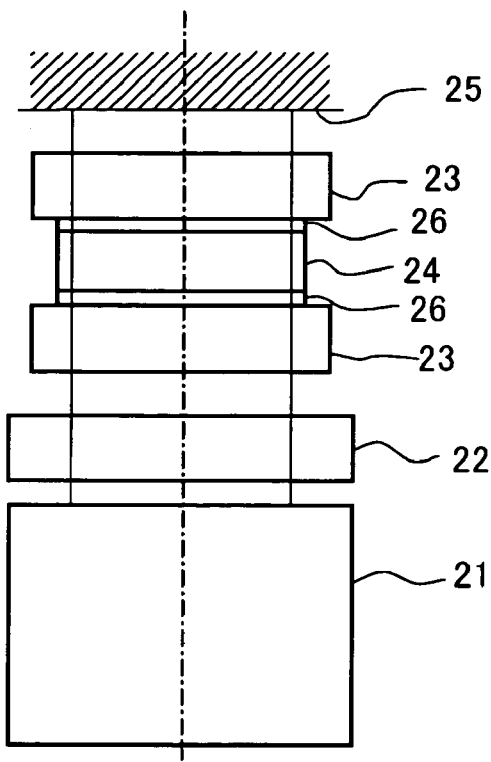
FIG. 11B shows a state in which the optical member is set.

The same optical member as that used in Example 1 is set to the same vertical type Fizeau interferometer as that used in Example 1. However, the optical member was not retained by the retaining apparatus shown in FIG. 1. The optical member was interposed between the two parallel flat plates with the oil intervening therebetween as shown in FIG. 11B.

The measurement of the wave front aberration data and the calculation process for the measured values were performed in the same manner as in Example 1. The values of the respective components are shown in FIG. 6. That is, the lower order $r_{rot}$ was 0.05 $\lambda$, the lower order $r_{odd}$ was 0.02 $\lambda$, the lower order $r_{evn}$ was 0.02 $\lambda$, the middle order $r_{rot}$ was 0.015 $\lambda$, the middle order $r_{odd}$ was 0.008 $\lambda$, the middle order $r_{evn}$ was 0.008 $\lambda$, the higher order $r_{rot}$ was 0.003 $\lambda$, the higher order $r_{odd}$ was 0.003 $\lambda$, the higher order $r_{evn}$ was 0.003 $\lambda$, and the residual RMS was 0.004 $\lambda$ with respect to the light source wavelength $\lambda$, respectively. It was judged that the optical member was unusable for the photolithography. Although the same optical member as those used in Examples 1 and 2 was measured, the optical member was judged to be unusable in Comparative Example 1, probably for the following reason. That is, it is considered that any bending appeared in the parallel flat plate, because all of the load of the optical member was applied to the parallel flat plate disposed on the lower side. It is considered that the wave front aberration inherent in the interferometer greatly differed between the state in which the optical member was set and the state in which the optical member was not set. Further, it is considered that the oil flowed due to the load of the optical member.

COMPARATIVE EXAMPLE 2

The same optical member as that used in Example 1 is set to the lateral type Fizeau interferometer for measuring the flat surface optical member. That is, the mass of the optical member is retained at two positions disposed at lower portions of the side surface so that the surface of the optical member, into which the beam comes, is in the vertical direction. The lateral type Fizeau interferometer is constructed similarly to the vertical type Fizeau interferometer used in Example 1 except that the arrangement of the optical system is of the lateral type. The measuring performance is also equivalent to that of the vertical type Fizeau interferometer described above. In this state, the wave front aberration is measured for measuring points ($\rho$, $\theta$) of 100×100 meshes in accordance with the oil-on-plate method. The procedure, in which the measured wave front aberration data is subjected to the Zernike fitting, is performed in the same manner as in Example 1. The values of the respective components are shown in FIG. 6. That is, the lower order $r_{rot}$ was 0.04 λ, the lower order $r_{odd}$ was 0.02 λ, the lower order $r_{evn}$ was 0.02 λ, the middle order $r_{rot}$ was 0.01 λ, the middle order $r_{odd}$ was 0.008 λ, the middle order $r_{evn}$ was 0.008 λ, the higher order $r_{rot}$ was 0.003 λ, the higher order $r_{odd}$ was 0.003 λ, the higher order $r_{evn}$ was 0.003 λ, and the residual RMS was 0.003 λ with respect to the light source wavelength λ, respectively. As a result of the comparison of these values with the known reference values, it was judged that the optical member was unusable for the photolithography. Although the same optical member as that used in Example 1 was measured, the optical member was judged to be unusable in Comparative Example 2, probably for the following reason. That is, it is considered that any bending appeared in the optical member, because all of the load of the optical member was concentrated on the lower side support portion. Further, it is considered that the oil flowed due to its self-weight.

MODIFIED EXAMPLE 1

A modified example of the method for retaining the optical member is shown below. As shown in FIGS. 3A and 3B, the side surface of the optical member 1 can be processed to have a flanged shape, and a flange 1a can be retained at lower portions by using four plates 2. The chips 2a of the plate are processed to match the outer circumferential shape of the columnar optical member. This method is also an embodiment of the method for retaining the side surface as referred to in the present invention. In this method, it is necessary that all of the optical members to be measured are processed to have the shape as described above. However, unlike the retaining method shown in FIG. 1, the pressing force, which is directed toward the center of the optical member 1, is not generated.

MODIFIED EXAMPLE 2

Figure 4A:
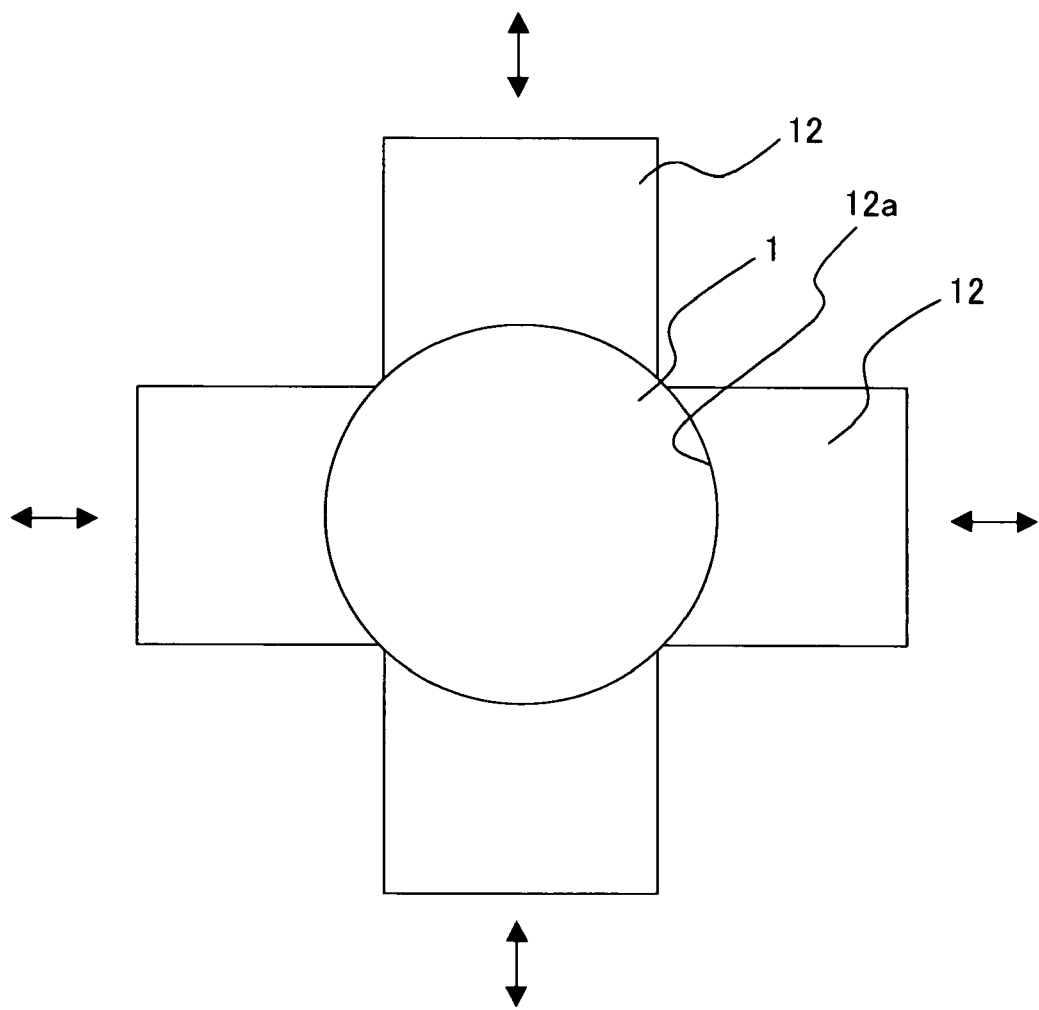
Figure 4B:
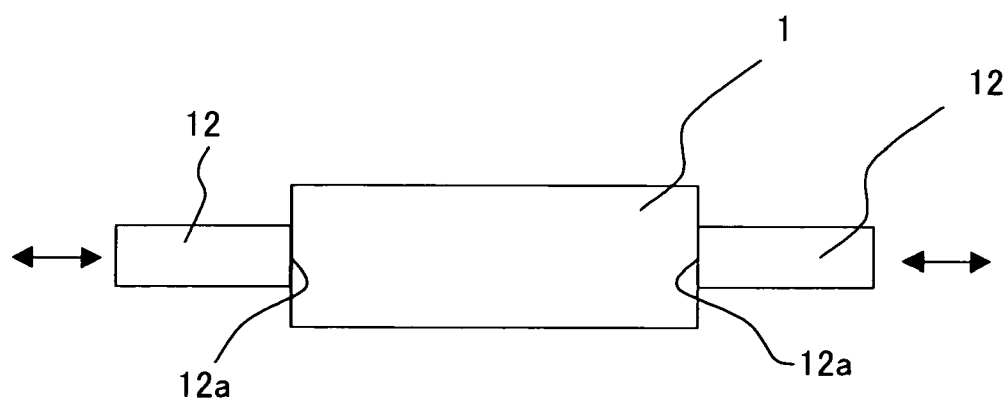

In Modified Example 2, as shown in FIGS. 4A and 4B, four retaining plates 12, each of which has a circular arc-shaped tip 12a capable of retaining approximately ¼ of the outer circumferential surface of the optical member, are used, and they are pressed in directions toward the center of the optical member 1. The optical member 1 is retained by the frictional force generated between the optical member 1 and the plates 12. In this method, it is necessary that the plates 12 are processed to make coincidence with the outer circumferential curvature of the optical member highly accurately.

Figure 5A:
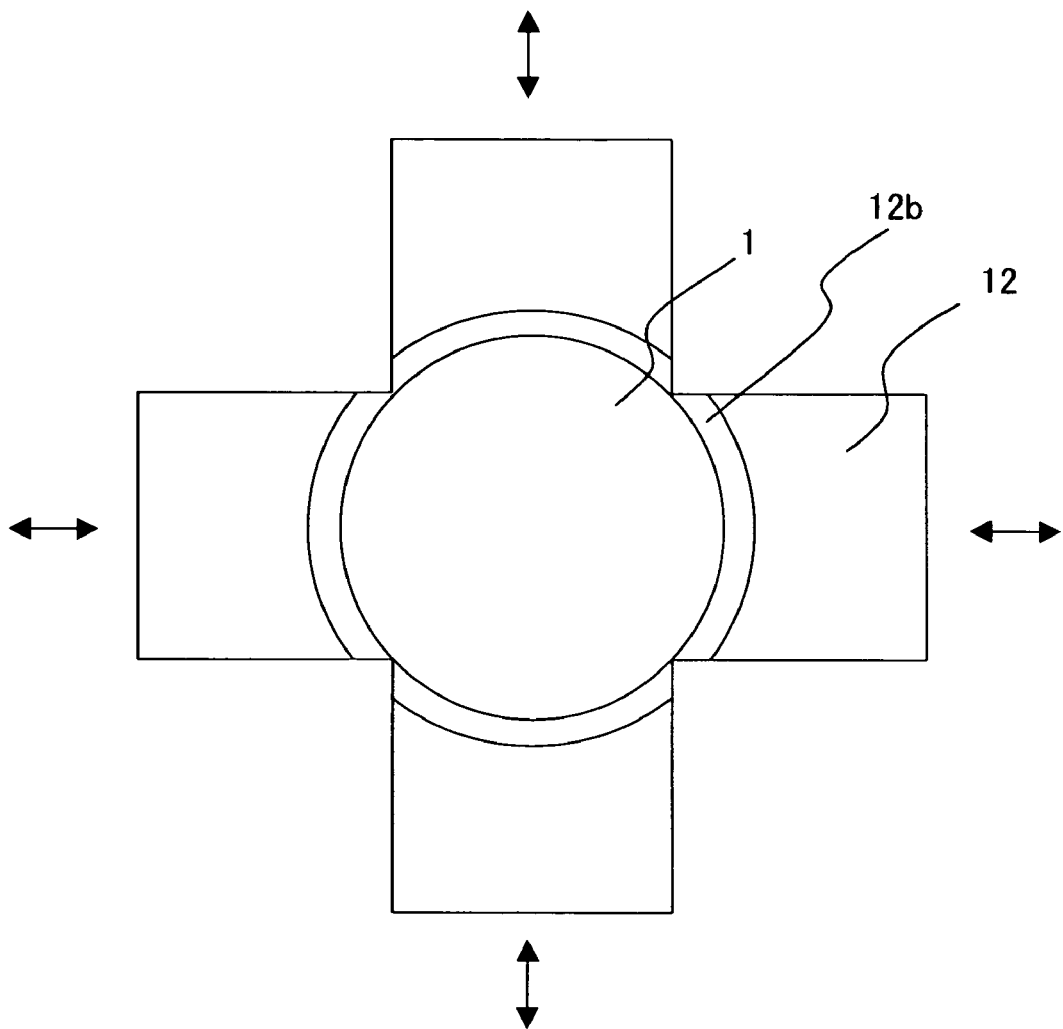
Figure 5B:
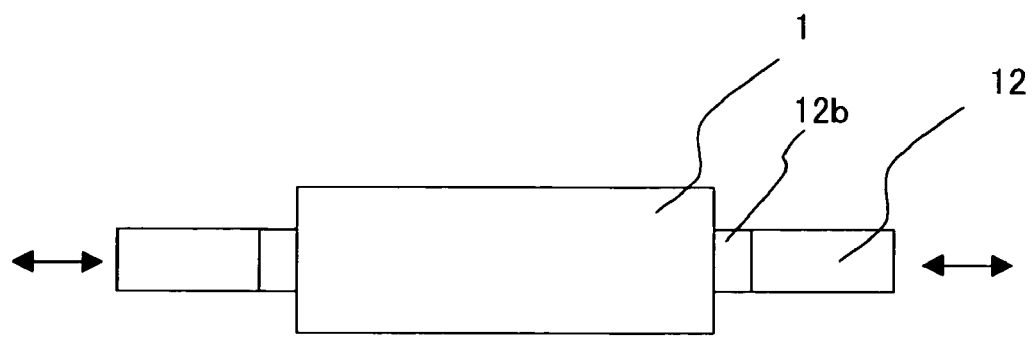

In still another modified example, as shown in FIGS. 5A and 5B, elastic members 12b may be provided at the tips of the plates 12.

As explained above, according to the present invention, the wave front aberration is measured while retaining the optical member. Therefore, it is possible to suppress the measurement error which would be otherwise caused by the bending of the optical member and/or the parallel flat plate and the flow of the oil, and it is possible to measure the refractive index homogeneity of the optical member highly accurately. Therefore, the method of the present invention is useful to evaluate the optical member to be used for the photolithography in which the high resolution exposure is required, for example, as in the semiconductor exposure apparatus.

The invention claimed is:

1. A method for evaluating refractive index homogeneity of an optical member by measuring wave front aberration of the optical member, the method comprising:
   retaining a side surface around an optical axis of the optical member at a plurality of positions disposed at equal intervals, the side surface of the optical member being retained so that a surface of the optical member, into which a light beam comes, is horizontal; and
   measuring the wave front aberration by passing the light beam through the optical member, wherein:
   the optical member is a columnar optical member which has a center of rotation corresponding to the optical axis; and the optical member is rotated about the optical axis by an integral multiple of an angle corresponding to the equal interval, and the refractive index homogeneity of the optical member is evaluated by using wave front aberration data measured before the rotation and wave front aberration data measured after the rotation.

2. The method for evaluating the refractive index homogeneity of the optical member according to claim 1, wherein the optical member is arranged between two parallel flat plates, wherein gaps between the optical member and the two parallel flat plates are filled with an oil which has substantially the same refractive index as that of the optical member.

3. The method for evaluating the refractive index homogeneity of the optical member according to claim 2, further comprising:
   a first measuring step of measuring first wave front aberration data by passing the light beam through the two parallel flat plates in a state in which the two parallel flat plates are arranged close and in parallel to each other, and a gap between the two parallel flat plates is filled with the oil which has substantially the same refractive index as that of the optical member, before passing the light beam through the optical member;
   a second measuring step of measuring second wave front aberration data by passing the light beam through the two parallel flat plates and the optical member in a state in which the optical member is retained between the parallel flat plates and the optical member are filled with the oil;
   a step of calculating third wave front aberration data from a difference between the first wave front aberration data and the second wave front aberration data to evaluate the refractive index homogeneity of the optical member with the third wave front aberration data; and
   outputting the result of the evaluation.

4. The method for evaluating the refractive index homogeneity of the optical member according to claim 3, wherein:
   rotational asymmetry component of the wave front aberration is determined from a difference between the third wave front aberration data before the rotation and an average value of the third wave front aberration data after the rotation;
   the optical member is moved in a direction perpendicular to the optical axis to determine a difference between wave front aberration data obtained by transmitting the light beam through the optical member after the movement and the wave front aberration data obtained before the movement, and a rotational symmetry component of the wave front aberration is determined from the determined difference;
   the refractive index homogeneity of the optical member is evaluated from wave front aberration data obtained by adding the determined rotational asymmetry component and the rotational symmetry component; and outputting the result of the evaluation.

5. The method for evaluating the refractive index homogeneity of the optical member according to claim 1 wherein the side surface of the optical member is retained at the plurality of positions with elastic members respectively.

6. The method for evaluating the refractive index homogeneity of the optical member according to claim 5, wherein the elastic members are pressed against the side surface of the optical member toward the optical axis of the optical member.

7. The method for evaluating the refractive index homogeneity of the optical member according to claim 1, wherein the plurality of positions of the side surface of the optical member are not less than 4.

8. The method for evaluating the refractive index homogeneity of the optical member according to claim 1, wherein the plurality of positions of the side surface of the optical member are not less than 8.

9. The method for evaluating the refractive index homogeneity of the optical member according to claim 1, wherein the plurality of positions of the side surface of the optical member are not less than 12.

10. The method for evaluating the refractive index homogeneity of the optical member according to claim 1, wherein the optical member is an optical member used for photolithography.

* * * * *